(12) United States Patent
Kunii

(10) Patent No.: US 9,328,414 B2
(45) Date of Patent: May 3, 2016

(54) METHOD OF MANUFACTURING THIN FILM SEMICONDUCTOR DEVICE

(75) Inventor: Masafumi Kunii, Kanagawa (JP)

(73) Assignee: Japan Display Inc., Tokyo (JP)

( * ) Notice: Subject to any disclaimer, the term of this patent is extended or adjusted under 35 U.S.C. 154(b) by 1542 days.

(21) Appl. No.: 12/216,081

(22) Filed: Jun. 30, 2008

(65) Prior Publication Data

US 2009/0029530 A1    Jan. 29, 2009

(30) Foreign Application Priority Data

Jul. 25, 2007  (JP) .................................. 2007-192740

(51) Int. Cl.
*H01L 21/00* (2006.01)
*C23C 16/02* (2006.01)
*C23C 16/24* (2006.01)
*C23C 16/455* (2006.01)
*C23C 16/509* (2006.01)
*H01L 21/02* (2006.01)
*H01L 27/12* (2006.01)
*H01L 29/66* (2006.01)

(52) U.S. Cl.
CPC ......... *C23C 16/0245* (2013.01); *C23C 16/0272* (2013.01); *C23C 16/24* (2013.01); *C23C 16/45512* (2013.01); *C23C 16/45565* (2013.01); *C23C 16/5096* (2013.01); *H01L 21/0245* (2013.01); *H01L 21/0262* (2013.01); *H01L 21/02422* (2013.01); *H01L 21/02532* (2013.01); *H01L 21/02595* (2013.01); *H01L 27/1214* (2013.01); *H01L 29/66765* (2013.01); *H01L 21/02573* (2013.01)

(58) Field of Classification Search
CPC .................................................. C23C 16/0245
USPC .......................... 438/149; 257/289, E31.045
See application file for complete search history.

(56) References Cited

U.S. PATENT DOCUMENTS 5,232,868 A * 8/1993 Hayashi et al. ................. 438/96
5,246,886 A * 9/1993 Sakai et al. ................... 438/488
5,563,075 A   10/1996 Saito et al.
6,337,224 B1 * 1/2002 Okamoto et al. ............... 438/69

(Continued)

FOREIGN PATENT DOCUMENTS

CN    1658052 A    8/2005
JP    06-168882 A    6/1994

(Continued)

OTHER PUBLICATIONS

T. Kamei et al., "A Microscopic Role of Impurity on Growth Surface of Microcrystalline Silicon—Towards Larger Grain Size and Lower Defect Density-", Bulletin of the Electrotecnical Laboratory, 1999, pp. 37-41, vol. No. 12.
Czang-Ho Lee et al., "High-Mobility Nanocrystalline Silicon Thin-Film Transistors Fabricated by Plasma-Enhanced Chemical Vapor Deposition", Applied Physics Letters 86, American Institute of Physics, 2005, pp. 222106-1 to 222106-3.

(Continued)

*Primary Examiner* — Matthew Gordon
(74) *Attorney, Agent, or Firm* — Michael Best & Friedrich LLP

(57) ABSTRACT

Disclosed herein is a method of manufacturing a thin film semiconductor device includes the step of forming a silicon thin film including a crystalline structure on a substrate by a plasma CVD process in which a high order silane gas represented by the formula $Si_nH_{2n+2}$ (n=2, 3, ...) and a hydrogen gas are used as film forming gases.

17 Claims, 16 Drawing Sheets

(56) References Cited

U.S. PATENT DOCUMENTS

| | | | | |
|---|---|---|---|---|
| 2003/0013280 A1* | 1/2003 | Yamanaka | ............... | C23C 16/24 438/487 |
| 2005/0179036 A1 | 8/2005 | Yamazaki et al. | | |
| 2007/0298590 A1* | 12/2007 | Choi et al. | ................... | 438/478 |

FOREIGN PATENT DOCUMENTS

| | | |
|---|---|---|
| JP | 08-264440 A | 10/1996 |
| JP | 10-256164 A | 9/1998 |
| JP | 2001-068422 A | 3/2001 |
| JP | 2001-237189 A | 8/2001 |
| JP | 2006-176859 A | 7/2006 |

OTHER PUBLICATIONS

Japanese Office Action issued Jul. 28, 2009 for corresponding Japanese Application No. 2007-192740.

Japanese Office Action issued Oct. 6, 2009 for corresponding Japanese Application No. 2007-192740.

Wang, Y.H., "Structural and Optical Properties of a-Si : H/nc-Si : H Thin Films Grown From $Ar-H_2-SiH_4$ Mixture by Plasma-Enhanced Chemical Vapor Deposition" Elsevier, Materials Science & Engineering B (B104), 2003.

Taiwanese Office Action issued Oct. 24, 2014 for corresponding Taiwanese Application No. 097123946.

\* cited by examiner

METHOD OF MANUFACTURING THIN FILM SEMICONDUCTOR DEVICE

CROSS REFERENCES TO RELATED APPLICATIONS

The present invention contains subject matter related to Japanese Patent Application JP 2007-192740 filed in the Japan Patent Office on Jul. 25, 2007, the entire contents of which being incorporated herein by reference.

BACKGROUND OF THE INVENTION

1. Field of the Invention

The present invention relates to a method of manufacturing a thin film semiconductor device, particularly to a method of manufacturing a thin film semiconductor device such as a thin film transistor, a display device having thin film transistors, and photoelectric conversion devices represented by solar cells and sensors using a semiconductor thin film.

2. Description of the Related Art

In flat panel displays such as liquid crystal displays and organic EL displays, thin film transistors (TFTs) are provided as driving elements for pixel electrodes. Among the TFTs, the poly-Si TFT using polycrystalline silicon (poly-Si) as the material of the semiconductor thin film has drawn attention for the reasons that the driving circuit can be formed by use thereof and that the so-called system-on-glass can be derived by incorporating a high-function circuit in the panel. In order to realize the formation of the poly-Si TFTs on a low-cost glass substrate, development of the so-called low-temperature poly-Si process with the manufacturing process temperature kept at or below 600° C. has been conducted.

For manufacturing the poly-Si TFTs by the low-temperature poly-Si process, there has hitherto been known a method in which a film of amorphous silicon is formed on a low-melting-point glass substrate by plasma CVD or the like, and the amorphous silicon film is crystallized by irradiation with an energy beam such as a laser beam and an electron beam.

As the energy beam for crystallizing the amorphous silicon, for example, an excimer laser with a wavelength of 308 nm obtained by exciting a XeCl gas is generally used. Specifically, a method in which the laser beam is shaped into a line-form beam and the glass substrate is scanned with the line-form beam to crystallize the glass substrate over the whole surface area thereof is used on an industrial basis.

In the case of using such a laser anneal process, however, the laser annealing apparatus has to be equipped with a precision optical system, a large-scale stabilizer for stable laser oscillation, and the like, which leads to a rise in equipment cost. In addition, due to limitations as to the optical system and the oscillation energy of the laser beam, a certain limit is imposed on the size of the laser beam, and it is difficult to irradiate a large-area substrate uniformly with the laser beam. Therefore, taking an increase in the size of the substrate into account, the laser anneal process is not necessarily desirable from the viewpoint of productivity. Furthermore, the polycrystalline silicon obtained through laser beam crystallization is liable to show a dispersion of crystal grain size due to the dispersion of laser beam energy, resulting in dispersions of TFT characteristics.

To overcome this problem, there have been proposed some methods for directly building up a silicon thin film including a crystalline structure on a substrate, without performing laser annealing.

For example, Japanese Patent Laid-Open No. 2001-68422 (hereinafter referred to as Patent Document 1) discloses a reactive thermal CVD process, i.e., a process in which an etching gas and film forming gases are introduced onto a heated substrate, the film forming gases are thermally activated by the heated substrate in the presence of the etching gas so as to bring about a thermochemical reaction, whereby a crystalline semiconductor thin film is directly formed.

On the other hand, Japanese Patent Laid-Open No. Hei 6-168882 (hereinafter referred to as Patent Document 2) discloses the formation of a silicon thin film by a plasma CVD process in which a silane-(silane fluoride)-fluorine gas system is used. The document also describes that the silicon thin film obtained by this process shows a sharp Raman spectrum based on crystalline silicon.

In addition, Kamei et al., Electrotechnical Laboratory Bulletin, Vol. 63, No. 1-2, p. 37 (1999) (hereinafter referred to as Non-Patent Document 1) describes that an improvement in crystallinity is observed when the concentration of oxygen in a silicon thin film is reduced by use of ultra-high gas purities in a plasma CVD film forming process.

Besides, C-H Lee et al., Applied Physics Letters 86, (2005), Paper No. 222106 (hereinafter referred to as Non-Patent Document 2) describes that when the gas flow rate ratio $r=(H_2)/(SiH_4)$ between a monosilane gas (SiH4) and a hydrogen gas is set at or above 100, the concentration of the silicon thin film thus formed can be lowered to or below $1.5\times1017$ cm-3, and that an improved crystallinity is considered to be achieved by the reduction in oxygen concentration.

SUMMARY OF THE INVENTION

For example in the reactive thermal CVD process of Patent Document 1, however, the substrate temperature has to be not less than 400° C., which is the decomposition temperature of disilane used as the film forming gas, and has to be not less than 450° C. for obtaining a sufficient film forming rate. In the case where the substrate temperature is 450° C. or above, it is difficult to cope with the temperature by use of a general SUS steel-made CVD chamber, and there is a need to design the CVD film forming apparatus with special heat resistance specifications. In addition, even where the substrate temperature is set at 450° C., the film forming rate in the reactive thermal CVD process not using a plasma reaction is no more than about 8 to 9 nm/min, which makes it difficult to put the process to practical use on an industrial basis.

On the other hand, in the method of forming a crystalline semiconductor thin film by the plasma CVD process as described in Patent Document 2, the proportion of the amorphous component in the film is high in the beginning period of crystal growth. This results in the problem that it is difficult to obtain sufficient performance with a bottom gate type TFT in which crystallinity of the semiconductor thin film, especially in the vicinity of its interface on the substrate side, is of importance.

Further, in the method of improving the crystallinity by adopting ultra-high purities of film forming gases in the plasma CVD film forming process as described in Non-Patent Document 1, modifications of the film forming gases, piping, and the film forming chamber for compatibility with the ultra-high impurities would cause a rise in the cost of the manufacturing apparatus, and such an apparatus is impractical for industrial use where, especially, a large glass substrate of several meters square is treated.

Besides, in the method of lowering the impurity concentration in the film in an ordinary plasma CVD apparatus by raising the ratio of dilution of the silane gas with hydrogen as described in Non-Patent Document 2, the film forming rate is as low as about 6 nm/min, which means a poor productivity.

Thus, there is a need for a method of manufacturing a thin film semiconductor device by which a crystalline silicon thin film with a stable crystallinity ratio in the film thickness direction can be formed on a substrate while maintaining a sufficient film forming rate even at a low substrate temperature, the formation of the crystalline silicon thin film directly on a substrate can be put to practical use on an industrial basis, and the device performance can be enhanced through the use of the silicon thin film.

According to an embodiment of the present invention, there is provided a method of manufacturing a thin film semiconductor device which includes a silicon thin film as a semiconductor thin film. The method includes the step of forming a silicon thin film including a crystalline structure on a substrate by a plasma CVD process in which a high order silane gas represented by the formula $Si_nH_{2n+2}$ (n=2, 3, . . . ) and a hydrogen gas are used as raw material gases.

It has been confirmed that, in the manufacturing method as above, the use of the high order silane gas and the hydrogen gas as the film forming gases in forming the silicon film by the plasma CVD process ensures that a crystalline silicon thin film with a stable crystallinity ratio in the film thickness direction can be formed while maintaining a sufficient film forming rate even at a low substrate temperature.

According to the embodiment of the present invention as above, since the crystalline silicon thin film with a stable crystallinity ratio in the film thickness direction can be formed on the substrate while maintaining a sufficient film forming rate even at a low substrate temperature, the formation of the crystalline silicon thin film directly on a substrate can be put to practical use on an industrial basis, and it is possible to obtain a thin film semiconductor device enhanced in performance through the use of the silicon thin film.

DETAILED DESCRIPTION OF THE PREFERRED EMBODIMENTS

Now, embodiments relating to the method of manufacturing a thin film semiconductor device based on the present invention will be described in detail below, based on the drawings. Here, an embodiment of a film forming apparatus to be used in the method of manufacturing a thin film semiconductor device, an embodiment of a method of forming a crystalline silicon thin film using the film forming apparatus, and an embodiment of a method of manufacturing a thin film semiconductor device applying the film forming method, will be described in this order.

<Film Forming Apparatus>

Figure 1:
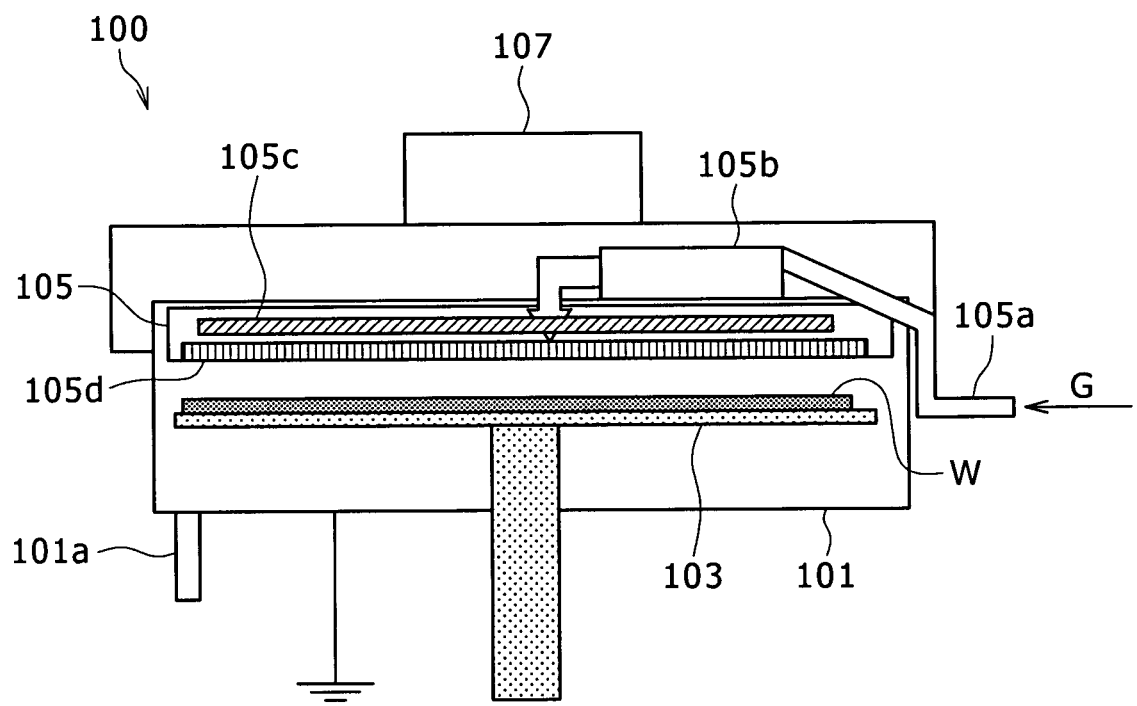
FIG. 1 is a configuration view showing an example of a film forming apparatus used in the manufacturing method according to an embodiment of the present invention.

FIG. 1 is an overall configuration view showing an example of the film forming apparatus to be used for manufacturing a thin film semiconductor device. The film forming apparatus 100 shown in the figure is a parallel flat plate type plasma CVD apparatus, which includes a process chamber 101 in which to conduct a film forming treatment, a stage 103 for stationarily holding a substrate W to be subjected to the film forming treatment in the process chamber 101, an upper electrode 105 disposed correspondingly to the stage 103, and a high-frequency power source 107 connected to the upper electrode 105.

Of these components, the process chamber 101 is provided in a grounded state, and is equipped with an exhaust pipe 101a for exhausting gases from the inside thereof.

The stage 103 functions also as a lower electrode, and is disposed in the process chamber 101, in the state of being grounded similarly to the process chamber 101. The stage 103, functioning also as the lower electrode, and the upper electrode 105 to be described below constitute parallel flat plates. In addition, the stage 103 may be provided with temperature control means for heating and holding the substrate W at a predetermined temperature.

The upper electrode 105 functions also as a shower head for supplying process gases into the process chamber 101, and is disposed opposite to the whole surface area of the substrate W stationarily held on the stage 103. A gas inlet pipe 105a is connected to the upper electrode 105. The gas inlet pipe 105a is provided with a gas mixing chamber 105b. The gases introduced through the gas inlet pipe 105a are mixed with each other in the gas mixing chamber 105b, and the gaseous mixture is introduced into the upper electrode 105, contributing to uniformization of film formation.

In addition, the upper electrode 105 as above is provided therein with a gas diffuser plate 105c, and, further, its surface opposed to the stage 103 is configured as a shower plate 105d. The diffuser plate 105c is provided for diffusing the introduced raw material gas evenly onto the whole surface of the substrate W, and the shower plate 105d is provided for supplying the gas diffused by the diffuser plate 105c onto the substrate W evenly. Incidentally, while only one system of the gas inlet pipe 105a is shown in the figure, a plurality of gas systems are provided, as demanded.

The high-frequency power source 107 is for impressing RF power (high-frequency power) on the upper electrode 105.

According to the film forming apparatus 100 configured as above, a film can be formed by a plasma CVD process in which a raw material gas plasma is generated on the upper side of the substrate W. Incidentally, the present invention is not limited to the film formation conducted by use of the parallel flat plate type plasma CVD apparatus shown here, and any apparatus that can form the film by a plasma CVD process can be similarly used.

<Film Forming Method 1>

Figure 2:
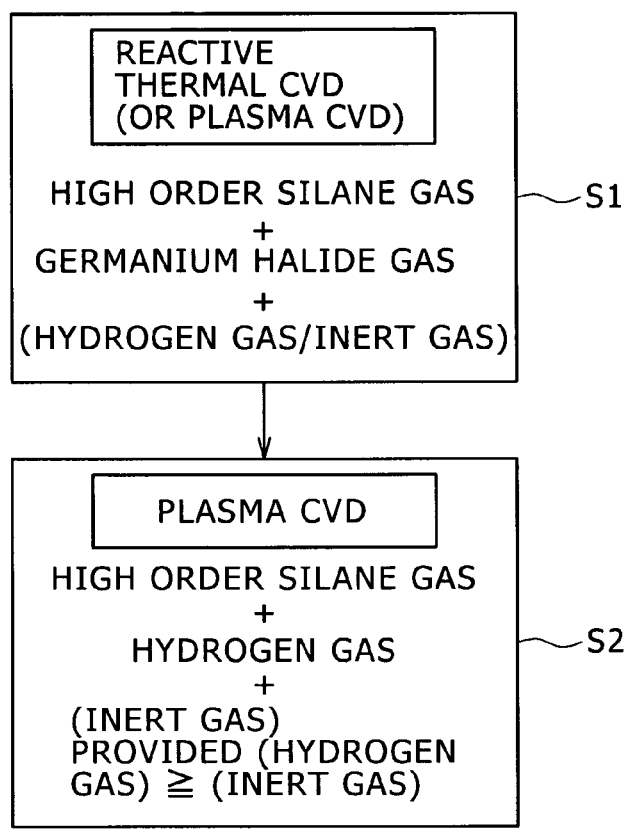
FIG. 2 is a flow chart of Film Forming Method 1 based on the invention.

A first example of the method of forming a crystalline silicon thin film using the film forming apparatus 100 as above-mentioned will be described below, referring to the flow chart shown in FIG. 2.

First, a thin film of silicon oxide, silicon nitride, silicon oxynitride or the like is formed on the substrate W such as a glass substrate. For example, a film of silicon oxide is formed in a thickness of about 100 nm by the plasma CVD process.

Next, a nucleation step S1 for producing crystalline nucleus on the film-forming surface of the substrate W is conducted.

Here, first, the substrate W is stationarily held on the stage 103 in the process chamber 101. Next, the pressure inside the process chamber 101 is set to a value of 13.3 to 1330 Pa, preferably 133 to 400 Pa, and the temperature of the substrate W is set at 100 to 600° C., preferably 300 to 450° C.

Subsequently, while maintaining the pressure inside the process chamber 101 and the temperature of the substrate W, a high order silane gas and a germanium halide gas are supplied through the gas supply pipe 105a as film forming gases. The high order silane gas used here is a silane gas represented by the formula $Si_nH_{2n+2}$ (n=2, 3, ...); for example, disilane ($Si_2H_6$) or trisilane ($Si_3H_8$) is used. Besides, as the germanium halide gas, for example, a germanium fluoride gas such as germanium tetrafluoride ($GeF_4$) and germanium difluoride ($GeF_2$) or a germanium chloride gas such as germanium tetrachloride ($GeCl_4$) is used.

In this case, the high-frequency power source 107 for impressing the RF power on the stage 103 and the upper electrode 105 are turned OFF, whereby production of crystalline nuclei by a reactive thermal CVD process is performed.

In the nucleation step S1 as above, further, an inert gas such as Ar, He, Ne, Kr, Xe and N.sub.2, and/or a hydrogen gas may be supplied as a diluting gas through the gas supply pipe 105a into the process chamber 101, if necessary. Besides, as for the flow rate ratio between the high order silane gas and the germanium halide gas, the ratio of (the flow rate of the germanium halide gas)/(the flow rate of the high order silane gas) is preferably not more than 1/10. The flow rate of the diluting gas is preferably in the range of 200 to 5000 sccm. In addition, where both the inert gas and the hydrogen gas are used as the diluting gas, it is preferable to set the flow rate of the hydrogen gas to be higher than that of the inert gas.

The nucleation step S1 as above-mentioned is carried out for 300 sec, for example.

Incidentally, the germanium halide gas and the high order silane gas used here will not react with each other at low temperatures of not more than about 300° C. Therefore, these gases are uniformly mixed with each other without reaction in the gas mixing chamber 105b. Accordingly, the raw material gas components are evenly supplied onto the large-area substrate, so that uniform nucleation can be effected throughout the substrate surface.

Besides, the nucleation step S1 may be carried out by a plasma CVD process. In this case, the gases to be used may be the same as those in the case of the reactive thermal CVD process, and the nucleation by the plasma CVD process is effected by impressing a high-frequency voltage on the stage 103 and the upper electrode 105.

Next, a film forming step S2 is conducted on the film-forming surface of the substrate W (which has been subjected to the nucleation) by a plasma CVD process.

Here, while maintaining the pressure inside the process chamber 101 and the temperature of the substrate W at the same values as in the nucleation step S1, the film forming gases to be supplied through the gas supply pipe 105a are switched to the high order silane gas and the hydrogen gas. Further, to these gases, an inert gas may be added. Incidentally, examples of the inert gas include Ar, He, Ne, Kr, Xe, and $N_2$.

Besides, a high-frequency voltage is impressed on the stage 103 and the upper electrode 105, thereby generating a plasma of the film forming gases.

In the film forming step S2, where the flow rate of the high order silane gas is taken as 1, the total flow rate of the film forming gases is not less than 50. Namely, as for ratio between the flow rate of the high order silane gas and the total flow rate of the film forming gases, the flow rate ratio $R=(Si_nH_{2n+2}+H_2+...)/(Si_nH_{2n+2}) \geq 50$. More preferably, the flow rate ratio $R \geq 60$.

In the case where the inert gas is added to the high order silane gas and the hydrogen gas used as the film forming gases, the inert gas is used at a flow rate of not more than the flow rate of the hydrogen gas, and it is preferable that the flow rate of the inert gas is less than the flow rate of the hydrogen gas. This ensures that the impurity concentration in the film formed is suppressed to a low level.

In this manner, a silicon thin film including a crystalline structure (hereinafter referred to as the microcrystalline silicon thin film) is formed on the substrate W.

Incidentally, in order to obtain normal thin film transistor characteristics, the concentration of oxygen in the microcrystalline silicon thin film has to be suppressed to or below $3 \times 10^{20}$ cm$^{-3}$. In the film forming method as above-described, therefore, film forming gases with purities of not less than 3N, preferably, not less than 4N are used, so as to restrain impurities from mixing into the microcrystalline silicon thin film being formed. Besides, for further suppressing the concentrations of impurity elements such as oxygen, carbon and nitrogen mixed into the microcrystalline silicon thin film being formed, the above-mentioned nucleation step S1 is desirably preceded by cleaning of the inside of the process chamber 101 by a plasma treatment using a cleaning gas (for example, a fluorine gas, a halogen fluoride gas, a $NF_3$ gas, a hydrogen gas, or the like). This is applicable to all of the following film forming methods described later.

In Film Forming Method 1 as above-described, the film forming step S2 for forming the microcrystalline silicon thin film is conducted under the condition where the crystalline nuclei have preliminarily produced by the nucleation step S1, so that a microcrystalline silicon thin film with good crystallinity can be obtained. Normally, the high order silane gas and the germanium halide gas used in the nucleation step S1 are each not be singly crystallized at low substrate temperatures of about 450° C. Therefore, in the ordinary thermal CVD process in which one of these gases is used alone, nucleation (formation of crystalline nuclei) will not take place. However, simultaneous use of the high order silane gas and the germanium halide gas as the film forming gases makes it possible to produce the crystalline nuclei by the reactive thermal CVD process at a low temperature of 450° C.

In the film forming step S2 following to the nucleation, a film is formed by a plasma CVD process using a high order silane gas as a film forming gas. By this configuration, it has been confirmed, the microcrystalline silicon thin film can be formed at a lower substrate temperature and at a 10 or more times higher film forming rate, as compared to the ordinary reactive thermal CVD process, as will be described in embodiments below.

In addition, in the film forming step S2, the hydrogen gas is used together with the high order silane gas, whereby the impurity concentrations (particularly, oxygen concentration) can be suppressed to a low level, and a microcrystalline silicon thin film enhanced in crystallinity thereby can be obtained.

Especially when the ratio R between the flow rate of the high order silane gas and the total flow rate of the film forming gases in the film forming step S2 is so set that $R=(Si_nH_{2n+2}+H_2+\ldots)/(Si_nH_{2n+2}) \geq 50$, preferably $R \geq 60$, microcrystalline silicon with a high crystallinity ratio can be obtained while maintaining the film forming rate of the microcrystalline silicon thin film more securely, as will be described in embodiments below.

Furthermore, it has been confirmed that in the microcrystalline silicon thin film formed by Film Forming Method 1 as above, crystal grains having a columnar crystalline structure are grown from the substrate surface, and a crystalline silicon thin film with good crystallinity throughout the whole region in the film thickness direction can be obtained, as will be described in embodiments below. This means that according to the film forming method based on the present invention, it is possible to obtain a microcrystalline silicon thin film with good crystallinity, particularly on the bottom surface side of the film formed. Therefore, for example in the case of a thin film transistor using the microcrystalline silicon thin film as a channel layer, adoption of a bottom gate type ensures that a microcrystalline silicon thin film portion with better crystallinity can be made to be a channel forming portion (namely, a portion on the gate electrode side), and an enhanced carrier mobility can be attained assuredly, which naturally is advantageous.

Thus, according to Film Forming Method 1, a microcrystalline silicon thin film with a stable crystallinity ratio in the film thickness direction can be formed on a substrate while maintaining a sufficient film forming rate even at a low substrate temperature. Therefore, the formation of the crystalline silicon thin film directly on a substrate can be put to practical use on an industrial basis, and it is possible to obtain a thin film semiconductor device enhanced in performance by use of the microcrystalline silicon thin film thus obtained.

<Film Forming Method 2>

Figure 3:
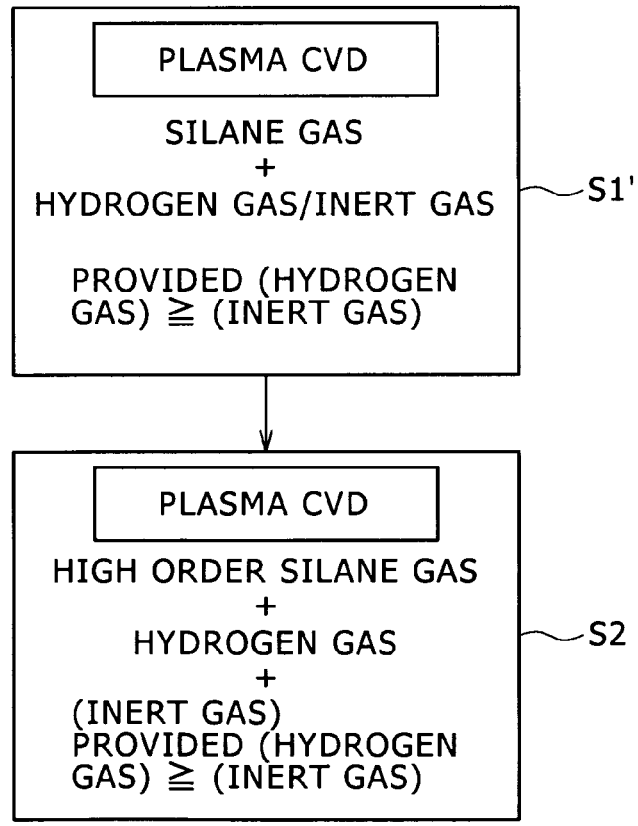
FIG. 3 is a flow chart of Film Forming Method 2 based on the invention.

A second example of the method of forming a crystalline silicon thin film by use of the above-mentioned film forming apparatus 100 will be described below, referring to the flow chart shown in FIG. 3. Film Forming Method 2 is the same as Film Forming Method 1, except that the film forming gases used in the nucleation step are modified.

More specifically, in a nucleation step S1' for producing crystalline nuclei on the film-forming surface of a substrate W, a plasma CVD process using at least one of a hydrogen gas and an inert gas together with the silane gas represented by the formula $Si_nH_{2n+2}$ (n=1, 2, 3, ...) as the film forming gas.

In this case, preferably, both the hydrogen gas and the inert gas are used together with the silane gas. The reason is as follows. When the plasma film formation is conducted by using only the silane gas and the inert gas, impurity elements composed mainly of the oxygen gas will easily be taken into the film from the chamber inner wall by a plasma impact due to the inert gas plasma. On the other hand, when the hydrogen gas is introduced simultaneously with these gases, the hydrogen gas shows a cleaning effect, whereby the impurity elements can be restrained from being taken into the film. Besides, when only the silane gas and the hydrogen gas are used, the nucleation ratio in the beginning period of film formation is so low that it is difficult to enhance the crystallinity ratio immediately above the substrate.

Incidentally, in the case where both the hydrogen gas and the inert gas are used, it is preferable to set the flow rate of the hydrogen gas to be higher than the flow rate of the inert gas, so as to enhance the cleaning effect while maintaining the above-mentioned crystallinity ratio.

In one specific example of the nucleation step S1' as above, $Si_2H_6$ (flow rate: 10 sccm) is used as the silane gas, an Ar gas (flow rate: 500 sccm) is used as the inert gas, a hydrogen gas (flow rate: 1000 sccm) is further used, and a plasma is applied for about 10 sec, thereby producing the crystalline nuclei.

A film forming step S2 conducted by a plasma CVD process after the above-mentioned nucleation step S1' is carried out in the same manner as the film forming step S2 in Film Forming Method 1.

In Film Forming Method 2 as above, also, the film forming step S2 for forming the microcrystalline silicon thin film is conducted under the condition where the crystalline nuclei have preliminarily been produced by the nucleation step S1', so that a microcrystalline silicon thin film with good crystallinity can be obtained. Thereafter, the same film forming step S2 as that in Film Forming Method 1 is conducted. Therefore, a microcrystalline silicon thin film with a stable crystallinity ratio in the film thickness direction can be formed on the substrate while maintaining a sufficient film forming rate even at a low substrate temperature, like in Film Forming Method 1. Consequently, the formation of the crystalline silicon thin film directly on a substrate can be put to practical use on an industrial basis, and it is possible to obtain a thin film semiconductor device enhanced in performance by use of the microcrystalline silicon thin film thus obtained.

<Film Forming Method 3>

Figure 4:
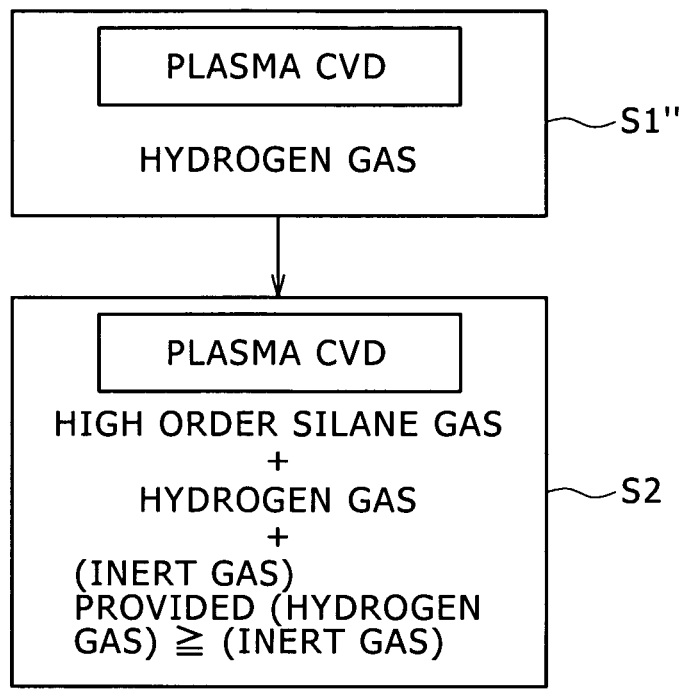
FIG. 4 is a flow chart of Film Forming Method 3 based on the invention.

A third example of the method of forming a crystalline silicon thin film by use of the above-mentioned film forming apparatus 100 will be described below, referring to the flow chart shown in FIG. 4. Film Forming Method 3 is the same as Film Forming Method 1, except that the film forming gases used in the nucleation step are modified.

More specifically, in a nucleation step S1" for producing crystalline nuclei on the film-forming surface of a substrate W, the silane gas is not used, and a hydrogen plasma treatment or an inert gas plasma treatment such as an Ar plasma treatment and a nitrogen ($N_2$) plasma treatment is performed.

In a specific example of the nucleation step S1", a plasma of a hydrogen gas (flow rate: 1000 sccm) is applied for 80 to 180 sec.

A film forming step S2 conducted by a plasma CVD process after the above-mentioned nucleation step S1" is carried out in the same manner as the film forming step S2 in Film Forming Method 1.

In Film Forming Method 3 as above, also, the film forming step S2 for forming the microcrystalline silicon thin film is conducted under the condition where the crystalline nuclei have preliminarily been produced by the nucleation step S1", so that a microcrystalline silicon thin film with good crystallinity can be obtained. Thereafter, the same film forming step S2 as that in Film Forming Method 1 is conducted. Therefore, a microcrystalline silicon thin film with a stable crystallinity ratio in the film thickness direction can be formed on the substrate while maintaining a sufficient film forming rate even at a low substrate temperature, like in Film Forming Method 1. Consequently, the formation of the crystalline silicon thin film directly on a substrate can be put to practical use on an industrial basis, and it is possible to obtain a thin film semiconductor device enhanced in performance by use of the microcrystalline silicon thin film thus obtained.

<Film Forming Method 4>

Figure 5:
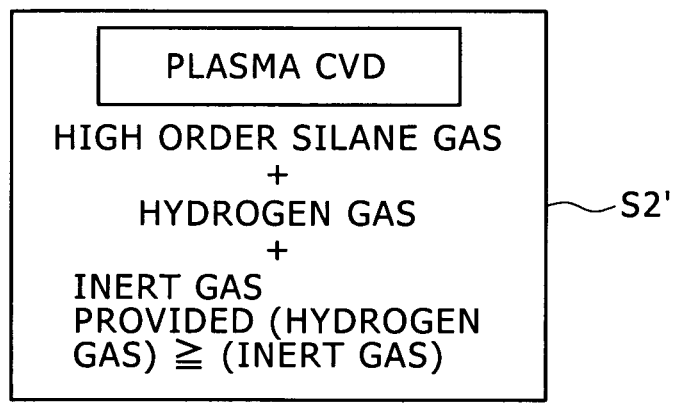
FIG. 5 is a flow chart of Film Forming Method 4 based on the invention.

A fourth example of the method of forming a crystalline silicon thin film by use of the above-mentioned film forming apparatus 100 will be described below, referring to the flow chart shown in FIG. 5. Film Forming Method 4 is a method in which nucleation is simultaneously conducted in a film forming step S2', without performing any special nucleation step beforehand.

Here, first, a substrate W is stationarily held on the stage 103 in the process chamber 101. Next, the pressure inside the process chamber 101 is set to 13.3 to 1330 Pa, preferably 133 to 400 Pa, and the temperature of the substrate W is set to 100 to 600° C., preferably 300 to 450° C.

Next, while maintaining the pressure inside the process chamber 101 and the temperature of the substrate W, a high order silane gas, a hydrogen gas, and an inert gas are supplied through the gas supply pipe 105*a* as film forming gases. Examples of the high order silane gas include $Si_2H_6$ and $Si_3H_8$, while examples of the inert gas include He, Ne, Ar, Kr, Xe, and $N_2$.

In this case, the inert gas is used at a flow rate of not more than the flow rate of the hydrogen gas, and it is preferable that the flow rate of the inert gas is lower than the flow rate of the hydrogen gas. This suppresses the impurity concentration in the film formed to a low level.

Then, a high-frequency voltage is impressed on the stage 103 and the upper electrode 105, so as to perform film formation by a plasma CVD process.

In the film forming step S2' as above, where the flow rate of the high order silane gas is taken as 1, the total flow rate of the film forming gases is set to be not less than 50. Namely, the ratio R between the flow rate of the high order silane gas and the total flow rate of the film forming gases is so set that $R=(Si_nH_{2n+2}+H_2+\ldots)/(Si_nH_{2n+2}) \geq 50$. More preferably, the flow rate ratio $R \geq 60$.

In this manner, the microcrystalline silicon thin film is formed on the substrate W.

In Film Forming Method 4 as above-described, the step of using the high order silane gas as the silane gas in the nucleation step (S1') in Film Forming Method 2 is extended as it is to constitute the film forming step S2', whereby it is possible to form a microcrystalline silicon thin film which simultaneously satisfy the properties demanded, i.e., a high film forming rate, a high crystallinity ratio, and a low oxygen concentration.

Film Forming Method 4 as above-described is particularly effective in forming a microcrystalline silicon thin film having a thickness of 100 nm or below.

<Film Forming Method 5>

As a fifth example of the method of forming a crystalline silicon thin film by use of the above-mentioned film forming apparatus 100, the case of forming an n-type microcrystalline silicon thin film or a p-type microcrystalline silicon thin film preliminarily doped with an n-type or p-type impurity (dopant) will be described below, based on application to Film Forming Methods 1 to 4.

In the procedure of Film Forming Methods 1 and 2, a dopant gas containing an impurity is added as a film forming gas in carrying out the film forming step S2.

On the other hand, in the procedure shown in Film Forming Method 3, a dopant gas containing an impurity is added as a film forming gas in carrying out the nucleation step S1" and the film forming step S2.

Further, in the procedure shown in Film Forming Method 4, a dopant gas containing an impurity is added as a film forming gas in carrying out the film forming step S2'.

The dopant gas added here may be phosphine ($PH_3$) which contains phosphorus (P) as an n-type impurity, in the case of forming an n-type microcrystalline silicon thin film. On the other hand, in the case of forming a p-type microcrystalline silicon thin film, the dopant gas may be diborane ($B_2H_6$) which contains boron (B) as a p-type impurity.

By such a film forming method, activation of the impurity (dopant) contained in the microcrystalline silicon thin film being formed can be performed simultaneously with the direct formation of the microcrystalline silicon thin film.

Incidentally, the process chamber 101 in which to form the microcrystalline silicon thin film containing the impurity in the activated state is desirably provided separately from the process chamber 101 in which to form the microcrystalline silicon thin film not containing such an impurity. This prevents the impurity from mixing into the microcrystalline silicon thin film not containing an impurity. Besides, in the case where a microcrystalline silicon thin film not containing an impurity and a microcrystalline silicon thin film containing an impurity are to be stackedly formed, it is preferable to use a multi-chamber type plasma CVD apparatus and to transfer the substrate W between the process chambers for the respective film forming processes without breaking the vacuum condition, so as to prevent penetration of impurities from the atmospheric air.

<Thin Film Semiconductor Device Manufacturing Method 1>

Now, a first example of a method of manufacturing a thin film semiconductor device by applying the above-described film forming method will be described below, based on sectional step views shown in FIGS. 6A to 6J. Incidentally, in the first example, description will be made of an embodiment in which the present invention is applied to fabrication of a driving panel for a display including a planar type bottom gate TFT of CMOS structure.

Figure 6A:
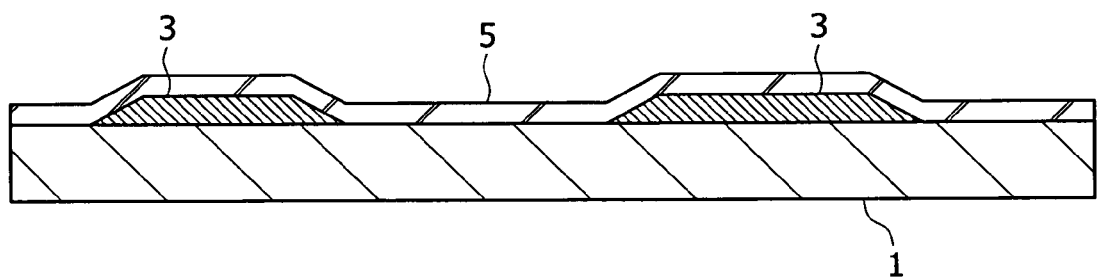
FIGS. 6A to 6J are sectional step views showing a first example of a thin film semiconductor device based on the invention.

First, as shown in FIG. 6A, an insulating substrate 1 is prepared. As the substrate 1, for example, AN100 produced by Asahi Glass Co., Ltd. or Code 1737 produced by Corning Incorporated or the like is appropriately used.

Gate electrodes 3 are patternedly formed on the substrate 1. Here, a metallic film of Mo, W, Ta, Cu or the like is formed by sputtering, and the metallic film is patterned to form the gate electrodes 3. Incidentally, the film thickness of the gate electrodes (metallic film) is 30 to 200 nm.

Next, by a film forming method such as a plasma CVD process and an LPCVD process, a silicon nitride film ($SiN_x$) for forming a gate insulation film 5 is formed in a thickness of 10 to 50 nm over the gate electrodes 3, and a silicon oxide film ($SiO_x$) is formed thereon in a thickness of 10 to 100 nm. By this, the gate insulation film 5 of a stacked structure composed of the silicon nitride film and the silicon oxide film is formed.

Figure 6B:
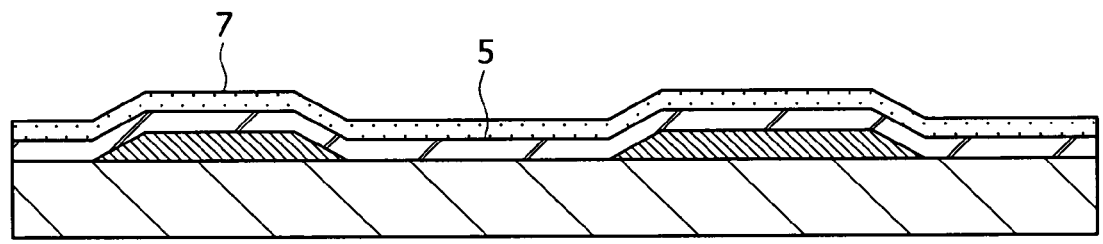

Thereafter, as shown in FIG. 6B, the nucleation step S1 and the subsequent film forming step S2 described in Film Forming Method 1 above are carried out, whereby a microcrystalline silicon thin film 7 not containing an impurity is formed. Here, the microcrystalline silicon thin film 7 having a thickness of 10 to 100 nm, preferably 40 nm, is formed.

The microcrystalline silicon thin film 7 will be an active layer of each TFT, and the concentration of impurity elements such as oxygen, carbon and nitrogen contained in the active layer is desirably not more than $3 \times 10^{20}$ cm$^3$. Therefore, as described in Film Forming Method 1 above, the inside of the process chamber is cleaned by plasma etching conducted by supplying a cleaning gas (for example, a fluorine gas, a halogen fluoride gas, an NF$_3$ gas or the like), and then the nucleation step S1 and the film forming step S2 as above-mentioned are carried out, whereby the concentration of these impurity elements is suppressed to a low level.

Incidentally, rapid thermal annealing (RTA) by use of a pulsed laser such as excimer laser, a gas laser such as Ar laser, a solid laser such as YAG laser, a semiconductor laser such as GaN, or a Xe (xenon) arc lamp or the like and irradiation with energy such as irradiation with a plasma jet may be applied to the microcrystalline silicon thin film 7 thus formed, thereby improving crystallinity of the latter.

Figure 6C:
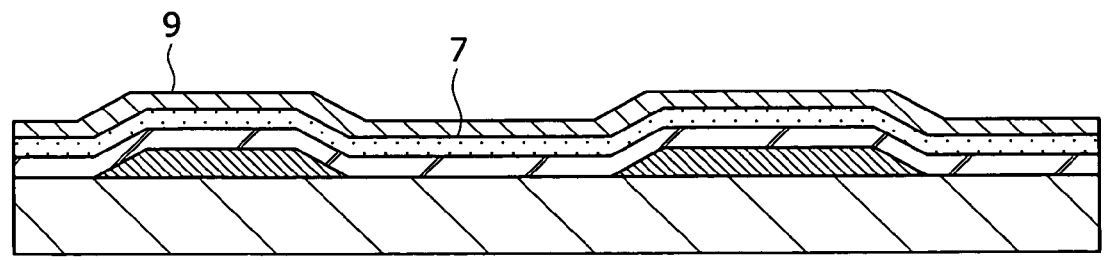

Next, as shown in FIG. 6C, a silicon oxide film 9 in a thickness of about 1 to 100 nm is stackedly formed on the microcrystalline silicon thin film 7 by plasma CVD or the like process.

Thereafter, if necessary, for the purpose of controlling Vth of the thin film transistor to be formed here, ion implantation of B$^+$ ions into the microcrystalline silicon thin film 7 in an injection dose of about 0.1E12 to 4E12/cm$^2$ is conducted. In this case, an acceleration voltage for the ion beam is set at about 20 to 200 keV.

Figure 6D:
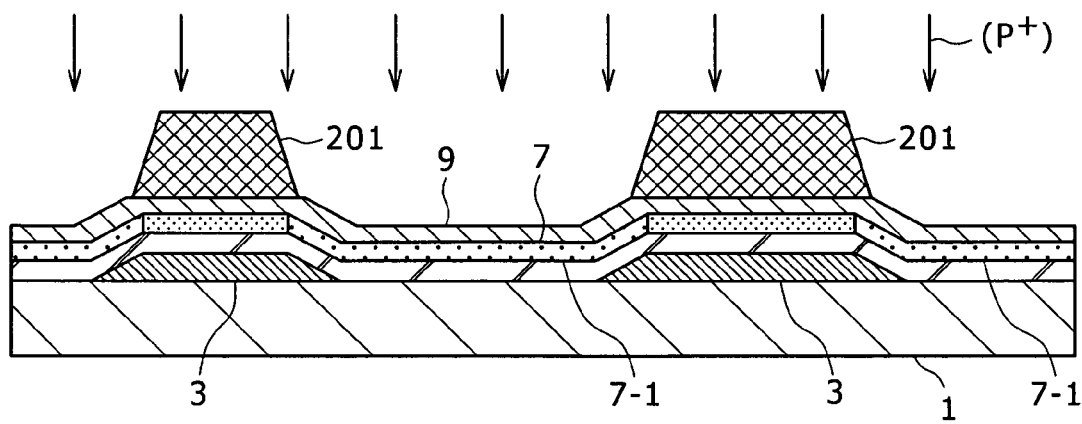

Next, as shown in FIG. 6D, back exposure from the side of the substrate 1 is conducted using the gate electrodes 3 as a mask, whereby a resist pattern 201 is formed on the silicon oxide thin film 9. Then, with the resist pattern 201 as a mask, ion implantation is conducted to introduce into the microcrystalline silicon thin film 7 an impurity for forming an LDD diffusion layer 7-1 of an n-type MOS transistor. In this case, mass separation type or non-mass-separation type ion implantation is conducted, for example, by using P$^+$ ions under the conditions of an injection dose of 6E12 to 5E13/cm$^2$ and an acceleration voltage of about 20 to 200 keV. After the ion implantation, the resist pattern 201 is peeled off.

Figure 6E:
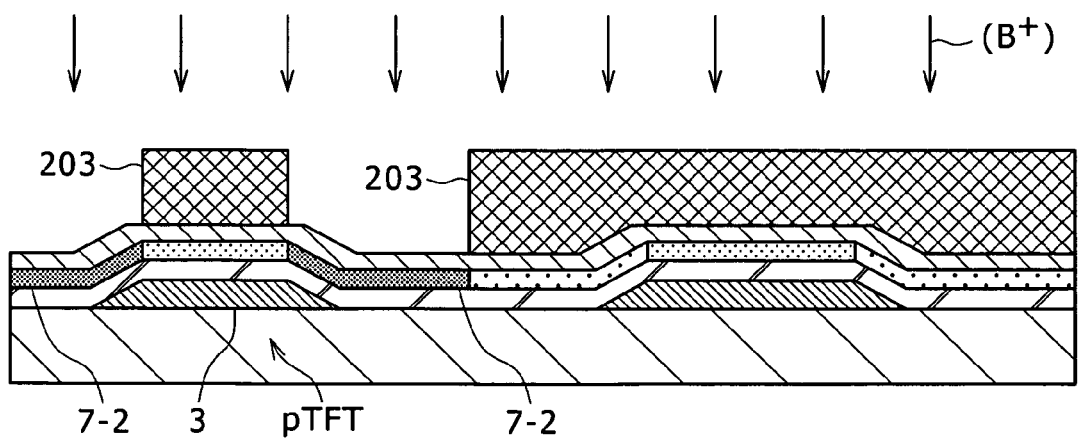
Figure 6E:
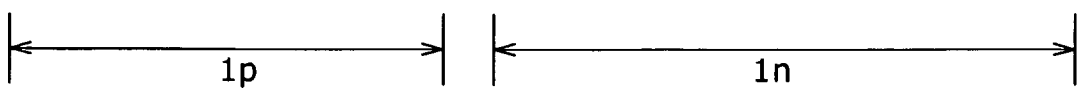

Subsequently, as shown in FIG. 6E, a resist pattern 203 covering an upper part of each gate electrode 3 in a p channel region 1$p$ and covering an n channel region 1$n$ is formed. Then, by ion implantation using the resist pattern 203 as a mask, introduction of an impurity for forming source/drain regions 7-2 of a p channel thin film transistor is conducted. In this case, mass separation type or non-mass-separation type ion implantation is conducted, for example, by using B$^+$ ions under the conditions of an injection dose of 1E14 to 3E15/cm$^2$ and an acceleration voltage of 5 to 100 keV. By this, a p channel thin film transistor (PTFT) is formed. After the ion implantation, the resist pattern 203 is peeled off.

Figure 6F:
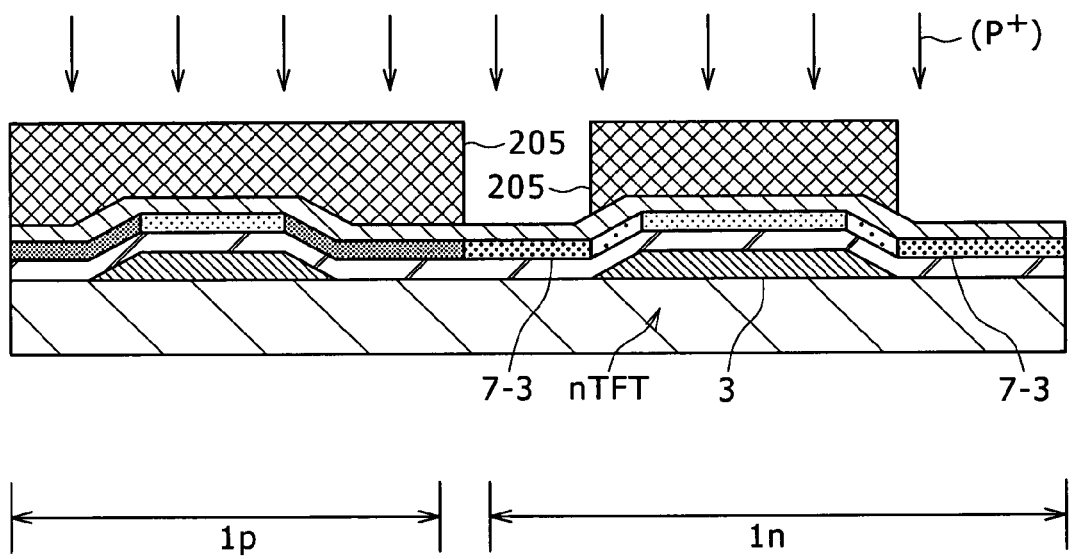

Next, as shown in FIG. 6F, a resist pattern 205 covering the p channel region 1$p$ and covering an upper part of the gate electrode 3 in the n channel region 1$n$ is formed. Then, by ion implantation using the resist pattern 205 as a mask, introduction of an impurity for forming source/drain regions 7-3 of an n channel thin film transistor is conducted. In this case, the ion implantation is carried out, for example, by using P$^+$ ions under the conditions of an injection dose of 1E15 to 3E15/cm$^2$ and an acceleration voltage of about 10 to 200 keV, to form an n channel thin film transistor (nTFT). After the ion implantation, the resist pattern 205 is peeled off.

After the ion implantation as above, the impurity introduced into the microcrystalline silicon thin film 7 is activated by rapid thermal annealing (RTA) such as IR lamp heating and combustion furnace heating or a laser annealing, furnace annealing in a N$_2$ atmosphere at or below 600° C. or the like.

Figure 6G:
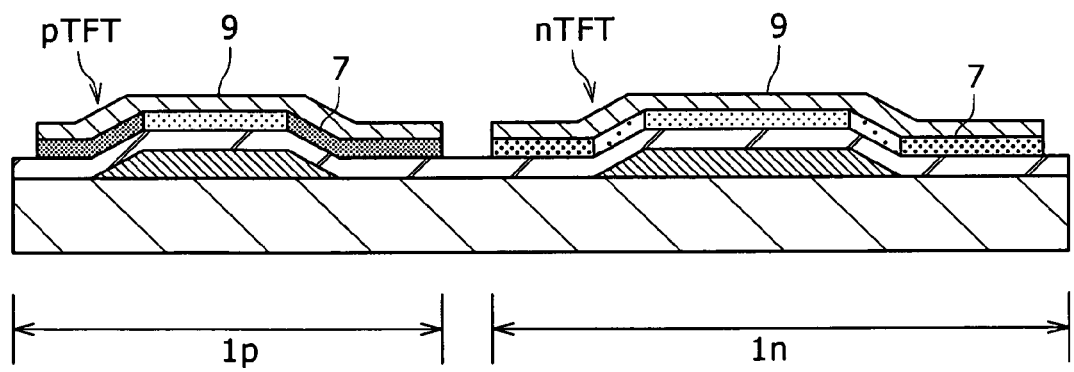

Thereafter, as shown in FIG. 6G, the silicon oxide film 9 and the microcrystalline silicon thin film 7 are simultaneously subjected to pattern etching, to bring each of the thin film transistors PTFT, nTFT into an island-like pattern.

Figure 6H:
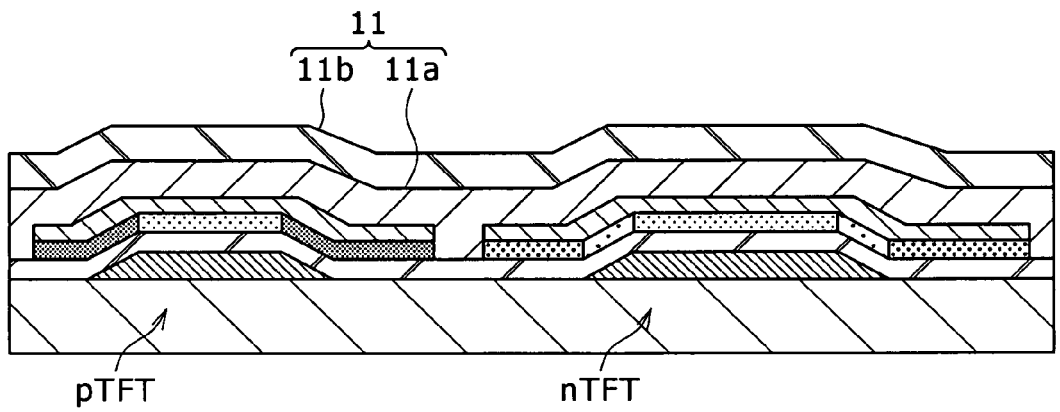

Next, as shown in FIG. 6H, a silicon oxide thin film 11$a$ and a hydrogen-containing silicon nitride thin film 11$b$ stacked in this order are formed in the state of covering each of the thin film transistors pTFT, nTFT present in the island-like pattern, to form an inter-layer insulation film 11 of a two-layer structure. Formation of these thin films is conducted, for example, by plasma CVD or the like.

At this stage, by an annealing treatment in an inert gas or a foaming gas or the like, a hydriding treatment is conducted in which hydrogen in the inter-layer insulation film 11, particularly hydrogen in the silicon nitride thin film 11$b$, is diffused into the microcrystalline silicon thin film 7. The annealing is preferably carried out, for example, at 400° C. for about 2 hr. By the hydriding treatment, dangling bonds in the microcrystalline silicon thin film 7 are eliminated, and the TFT characteristics can be enhanced. Incidentally, the hydriding treatment is not limited to the diffusion of hydrogen from the silicon nitride film 11$b$, but can also be achieved by subjecting the microcrystalline silicon thin film 7 to a hydrogen plasma atmosphere.

Figure 6I:
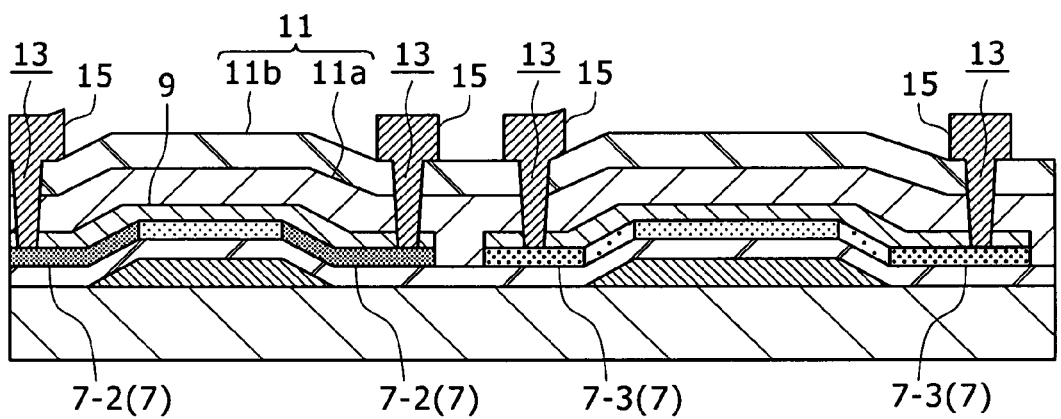

Subsequently, as shown in FIG. 6I, the inter-layer insulation film 11 and the silicon oxide film 9 are provided with contact holes 13 reaching the source/drain regions 7-2, 7-3 of the microcrystalline silicon thin film 7. Then, wiring electrodes 15 connected to the source/drain regions 7-2, 7-3 through the contact holes 13 are formed on the inter-layer insulation film 11. The wiring electrodes 15 are formed by sputtering a film of a wiring electrode material such as Al—Si, and patterning the sputtered film.

Figure 6J:
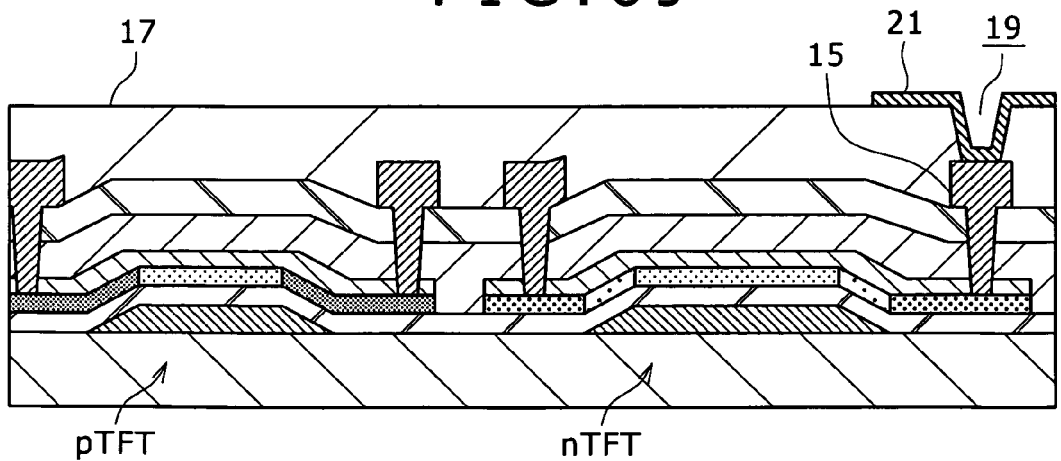

Thereafter, as shown in FIG. 6J, a flattening insulation film 17 formed of an acrylic organic resin, for example, is formed by application in a film thickness of about 1 μm. Next, the flattening insulation film 17 is provided with contact holes 19 reaching the wiring electrodes 15. Then, pixel electrodes 21 connected to the wiring electrodes 15 through the contact holes 19 are formed on the flattening insulation film 17. The pixel electrodes 21 can be formed, for example, by sputtering a film of ITO (Indium Tin Oxide) as a transparent conductive material, and patterning the sputtered film.

In addition, where the pixel electrodes 21 are formed of ITO, the pixel electrodes 21 are annealed in a nitrogen atmosphere at about 220° C. for 30 min.

Incidentally, here, in the driving panel for a display, the pixel transistor for driving the pixel electrode is an n channel type thin film transistor nTFT, a peripheral circuit is of the CMOS structure, and only the p channel type thin film transistor PTFT as a part of the peripheral circuit is shown.

By the foregoing, the driving panel is completed. Thereafter, for example in the case of a liquid crystal display, an orientation film is formed in the state of covering the pixel electrodes 21. Then, an opposite substrate on which opposite electrodes and an orientation film are formed in this order is prepared, and a liquid crystal layer is sealed between the orientation films, to complete the display. On the other hand, in the case of an organic EL display using organic electroluminescence devices, an organic layer including a light emitting layer is stackedly formed on the pixel electrodes, electrodes are provided on the organic layer, and, if necessary, the electrodes are covered with a protective layer, to complete the display.

According to the manufacturing method as above, the above-described film forming method is applied to the formation of the microcrystalline silicon thin film 7, the bottom gate type thin film transistors pTFT, nTFT in which the microcrystalline silicon thin film 7 formed while maintaining a film forming rate at such a level as to be suitable for practical use on an industrial basis is used as the channel layer are obtained. These thin film transistors pTFT, nTFT, with the crystalline silicon thin film 7 used as the channel layer, make it possible to configure a higher-performance circuit with a higher carrier mobility as compared with the case of amorphous silicon, and it is possible to enhance the performance of a display in which a driving circuit is configured by use of the thin film transistors pTFT, nTFT in this manner.

Furthermore, since the formation of the microcrystalline silicon thin film 7 is conducted at a low temperature, a metal with a comparatively low melting point such as Al, Cu, Ag and Au can be used to form the gate electrodes 3.

In addition, the thin film transistors can be fabricated by using only the plasma CVD apparatus, a metal sputtering apparatus, an exposure apparatus, and an etching apparatus, without using a complicated and expensive apparatus such as a laser crystallizing apparatus. This means that TFTs using a microcrystalline silicon thin film can be fabricated by a process which is comparable to that in the case of amorphous silicon TFTs. In other words, enlargement of a substrate similar to that in the case of amorphous silicon TFTs progressively enlarged in recent years can be achieved based on the present invention. Since it is also possible to cope with a large glass substrate of 2 m square or above generally expected to be used for the G8 generation and the latter generations, it is possible to manufacture large displays of not less than 50 inches in diagonal size, with a merit on an industrial basis.

Incidentally, while the thin film transistors pTFT, nTFT are shown to have a single-gate structure in this embodiment, the thin film transistor nTFT as the pixel transistor may be of the multi-gate structure having a plurality of gates between the source region and the drain region. The multi-gate structure TFT permits easier lowering of the OFF current as compared to the single-gate structure, which means effectiveness in the case of the microcrystalline silicon TFT higher in OFF current than the amorphous silicon TFT.

<Thin Film Semiconductor Device Manufacturing Method 2>

Now, a second example of the method of manufacturing a thin film semiconductor device by applying the above-described film forming method will be described below, based on sectional step views shown in FIGS. 7A to 7F. Incidentally, in the second example, description will be made of an embodiment in which the present invention is applied to the manufacture of a driving panel for a display having channel stop type bottom gate TFTs with a single channel configuration having only the n channel.

First, following the same procedure as that described referring to FIGS. 6A to 6C in the first example above, gate electrodes 3 are patternedly formed on an insulating substrate 1, a gate insulation film 5 is formed in the state of covering the gate electrodes 3, a microcrystalline silicon thin film 7 not containing an impurity is formed by the film forming method described in Film Forming Method 1 above, and a silicon oxide thin film 9 is formed. Then, if necessary, ion implantation for the purpose of controlling Vth of the thin film transistors to be formed is carried out.

Figure 7A:
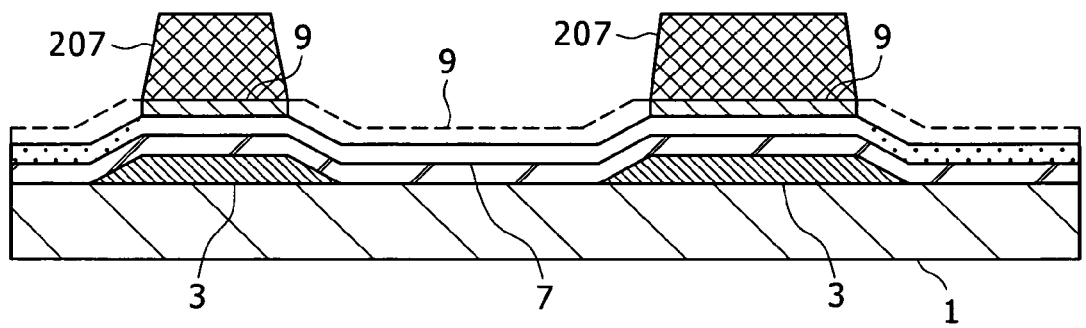
FIGS. 7A to 7F are sectional step views showing a second example of the thin film semiconductor device based on the invention.

Thereafter, as shown in FIG. 7A, a resist pattern 207 is formed on the silicon oxide thin film 9 by back exposure from the side of the substrate 1 by using the gate electrodes 3 as a mask. Then, by etching with the resist pattern 201 as a mask, the silicon oxide thin film 9 on the microcrystalline silicon thin film 7 is removed, leaving the silicon oxide thin film 9 on only the gate electrodes 3. After the etching, the resist pattern 207 is peeled off.

Figure 7B:
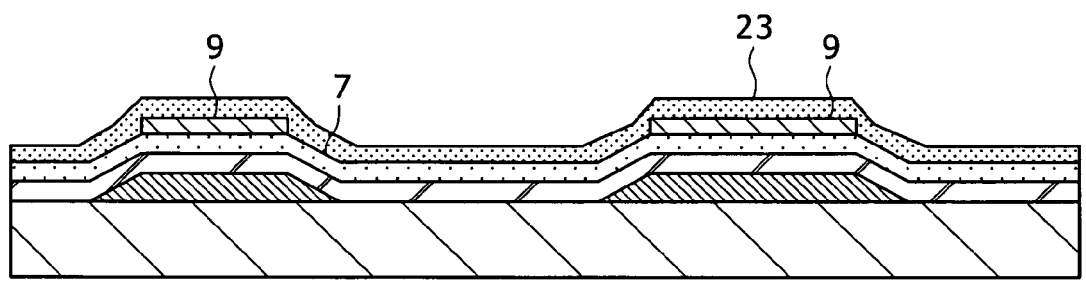

Next, as shown in FIG. 7B, a microcrystalline silicon thin film 23 containing an impurity in an activated state is formed by the film forming method descried in Film Forming Method 5 above. Here, a microcrystalline silicon thin film 23 having a thickness of 10 to 500 nm is formed. In this case, phosphine ($PH_3$) is used as the dopant gas, whereby a microcrystalline silicon 23 of the n type (hereinafter referred to as n-type microcrystalline thin film 23) is formed. In addition, the formation of the n-type microcrystalline silicon thin film 23 is conducted in a process chamber different from the process chamber for forming the microcrystalline silicon thin film 7 not containing an impurity. Incidentally, when diborane ($B_2H_6$) is used as the dopant gas, a p-type microcrystalline silicon thin film containing a p-type impurity in an activated state is obtained.

This ensures that the microcrystalline silicon thin film 7 formed previously constitutes a channel layer 7, while the n-type microcrystalline silicon thin film 23 containing the dopant which is formed here constitutes a source/drain layer 23.

Figure 7C:
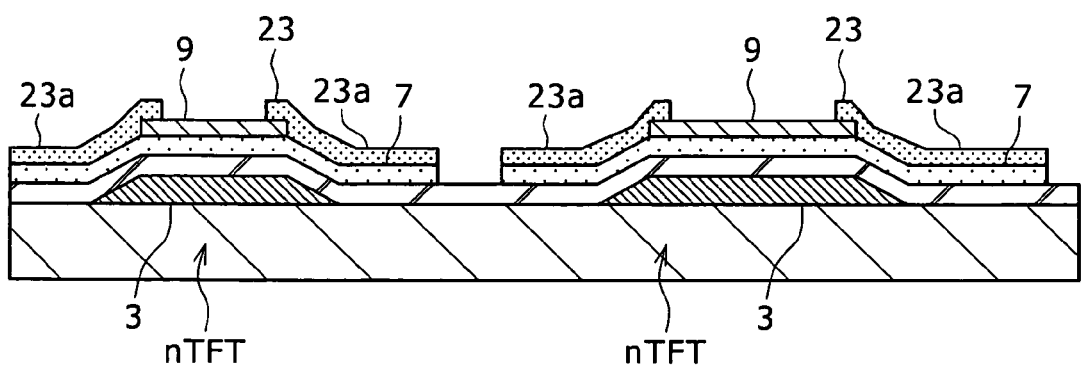

Next, as shown in FIG. 7C, the source/drain layer 23 and the channel layer 7 are simultaneously etched in the pattern of the source/drain layer 23, whereby island-like patterns are formed on the basis of the region of each of the thin film transistors.

Since the etching is stopped on the silicon oxide film 9 serving as an etching stop layer, the source/drain regions 23a and the channel layer 7 are simultaneously formed in a single step. By this, channel stop type thin film transistors nTFT of the n channel are formed.

Figure 7D:
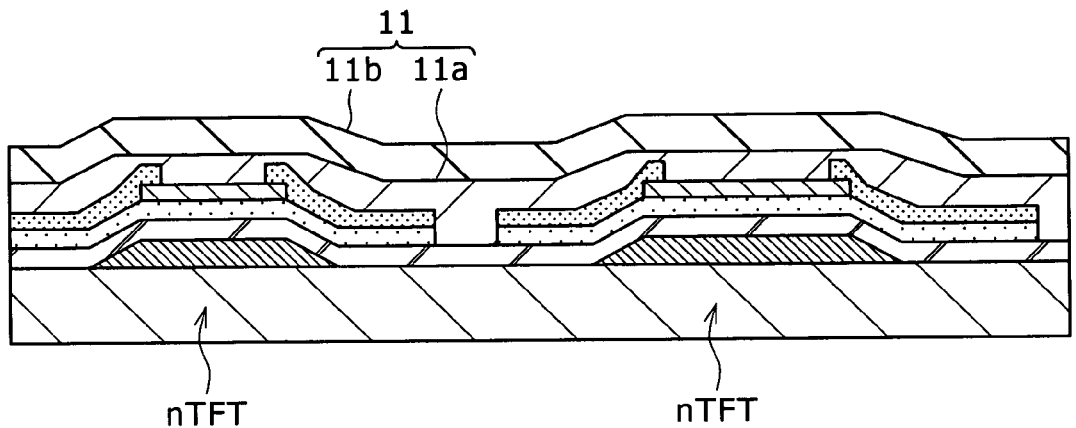
Figure 7E:
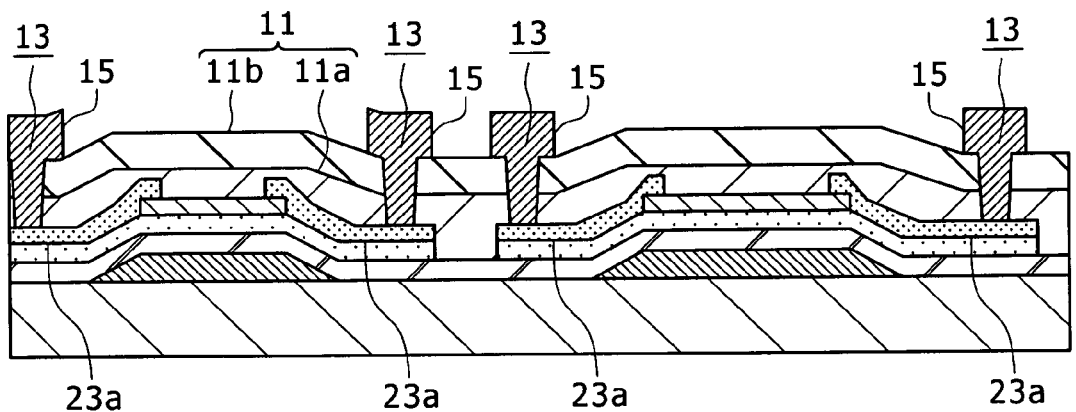
Figure 7F:
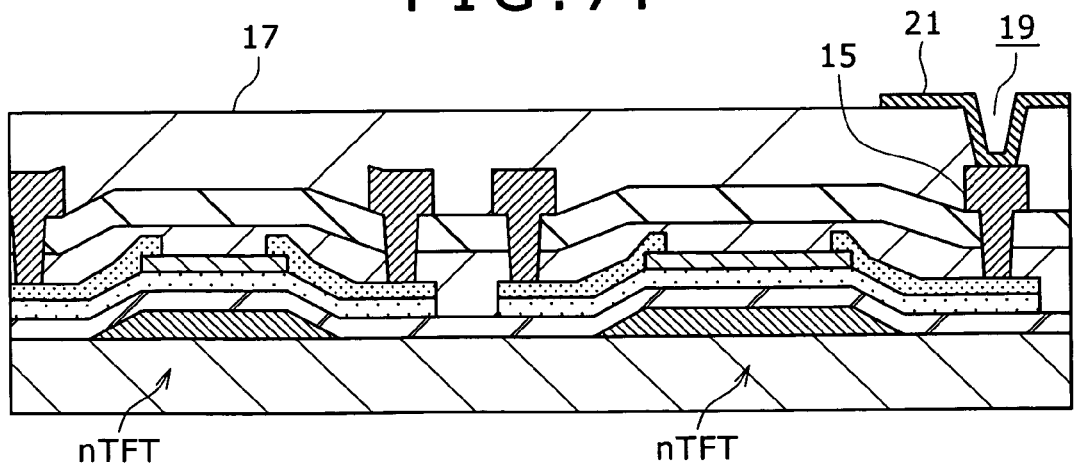

Thereafter, the steps shown in FIGS. 7D to 7F are conducted in the same manner as described referring to FIGS. 6H to 6J in the first example above.

Specifically, first, as shown in FIG. 7D, an inter-layer insulation film 11 having a two-layer structure composed of a silicon oxide thin film 11a and a hydrogen-containing silicon nitride thin film 11b is formed in the state of covering the thin film transistor nTFTs formed above. Thereafter, a hydriding treatment is conducted.

Next, as shown in FIG. 7E, the inter-layer insulation film 11 is provided with contact holes 13 reaching the source/drain regions 23a, and wiring electrodes 15 connected to the source/drain regions 23a are formed.

Thereafter, as shown in FIG. 7F, a flattening insulation film 17 is formed by application, and it is provided with contact holes 19 reaching the wiring electrodes 15 of the thin film transistors nTFT used as pixel transistors. Next, pixel electrodes 21 connected to the wiring electrodes 15 through the contact holes 19 are formed.

By the foregoing, the driving panel is completed. The subsequent procedure for manufacturing a display is the same as in the first example.

According to the second example of the manufacturing method as above, also, Film Forming Method 1 is applied to the formation of the microcrystalline silicon thin film 7, so that the same effects as those in the first example are obtained. In addition, Film Forming Method 5 is applied to the formation of the n-type microcrystalline silicon thin film 23 to be the source/drain regions 23a, so that it is possible to enhance the efficiency of the fabrication process of the channel stop type bottom gate TFTs. Furthermore, since the formation of the microcrystalline silicon thin film 7 and the n-type microcrystalline silicon thin film 23 is conducted at a low temperature, a metal having a comparatively low melting point such as Al, Cu, Ag and Au can be used to form the gate electrodes 3.

In this second example, description has been made of the formation of the channel stop type bottom gate TFTs having a single channel structure including only the n channel. In the case of a CMOS configuration, however, it suffices that the formation of the microcrystalline silicon thin film 23 is conducted twice, once for the n-type and once for the p-type. Besides, a combination of this with a p channel type thin film transistor of other structure may also be adopted.

<Thin Film Semiconductor Device Manufacturing Method 3>

Now, a third example of the method of manufacturing a thin film semiconductor device by applying the above-described film forming method will be described, based on sectional step views shown in FIGS. 8A to 8F. Incidentally, in this third example, description will be made of an embodiment in which the present invention is applied to the manufacture of a driving panel for a display having channel etch type bottom gate TFTs of a single channel configuration including only the n channel.

First, following the same procedure as described referring to FIGS. 6A and 6B in the first example above, gate electrodes 3 are patternedly formed on an insulating substrate 1, a gate insulation film 5 is formed in the state of the gate electrodes 3, and a microcrystalline silicon thin film 7 not containing an impurity is formed by the CVD film forming method in the embodiment described in Film Forming Method 1 above. Then, if necessary, ion implantation for the purpose of controlling Vth of the thin film transistor to be formed here is conducted.

Figure 8A:
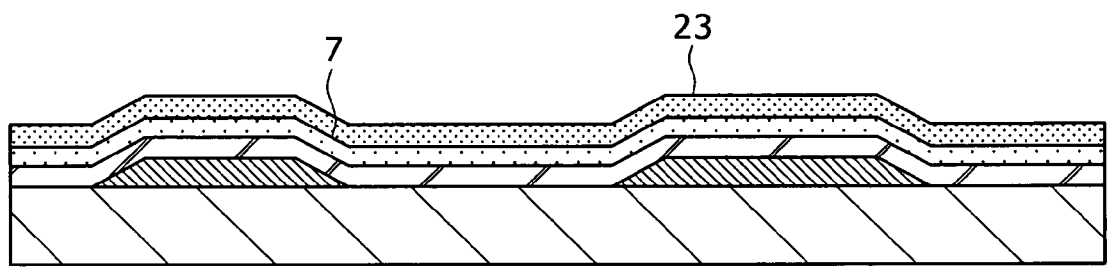
FIGS. 8A to 8F are sectional step views showing a third example of the thin film semiconductor device based on the invention.

Thereafter, as shown in FIG. 8A, a microcrystalline silicon thin film 23 containing an impurity in an activated state is formed by the CVD film forming method in the embodiment described in Film Forming Method 5 above. Here, a microcrystalline silicon thin film 23 having a thickness of 10 to 200 nm is formed. In this case, phosphine ($PH_3$) is used as the dopant gas, whereby microcrystalline silicon 23 of the n type (hereinafter referred to as the n-type microcrystalline silicon thin film 23) is formed. In addition, the formation of the n-type microcrystalline silicon thin film 23 is conducted in a process chamber different from the process chamber for forming the microcrystalline silicon thin film 7 not containing an impurity. It is to be noted here that it is preferable to form the n-type microcrystalline silicon thin film 23 by transferring the substrate without breaking the vacuum in the processing chambers, after the formation of the microcrystalline thin film 7. Incidentally, where diborane ($B_2H_6$) is used as the dopant gas, a p-type microcrystalline silicon thin film containing a p-type impurity in an activated state is obtained.

This ensures that the microcrystalline silicon thin film 7 formed previously constitutes a channel layer 7, while the n-type microcrystalline silicon thin film 23 containing the dopant which is formed here constitutes a source/drain layer 23.

Figure 8B:
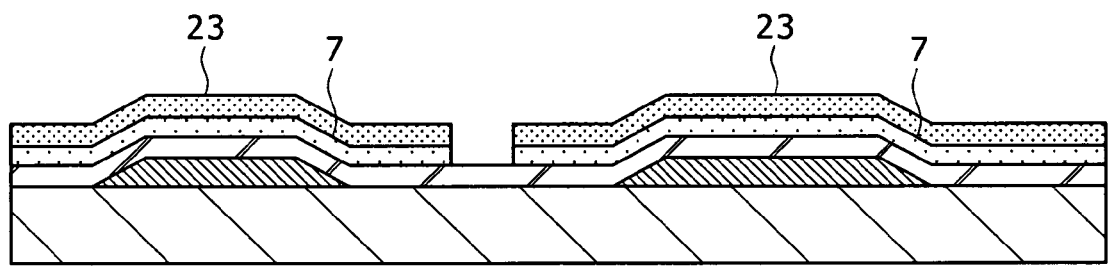

Next, as shown in FIG. 8B, the source/drain layer 23 and the channel layer 7 are simultaneously subjected to pattern etching, to obtain island-like patterns on the basis of the region of each of the thin film transistors.

Figure 8C:
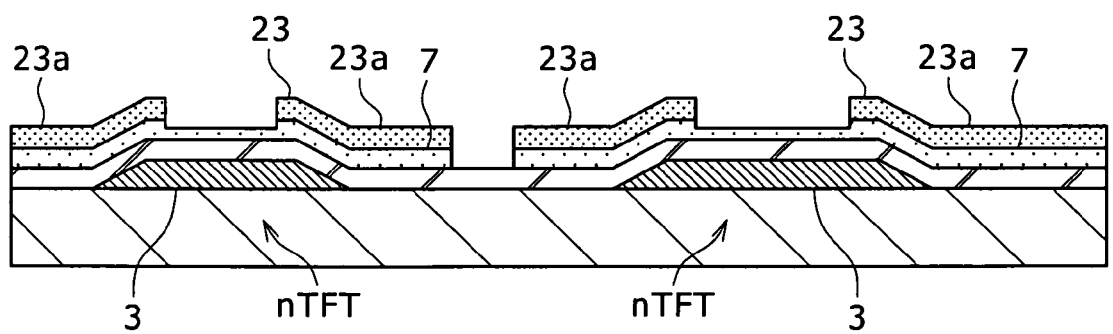

Thereafter, as shown in FIG. 8C, the source/drain layer 23 in the island-like pattern is subjected to pattern etching so as to be bisected on the upper side of the gate electrodes 3, thereby forming source/drain regions 23a. By this, channel etch type thin film transistors nTFTs of the n channel are formed.

Figure 8D:
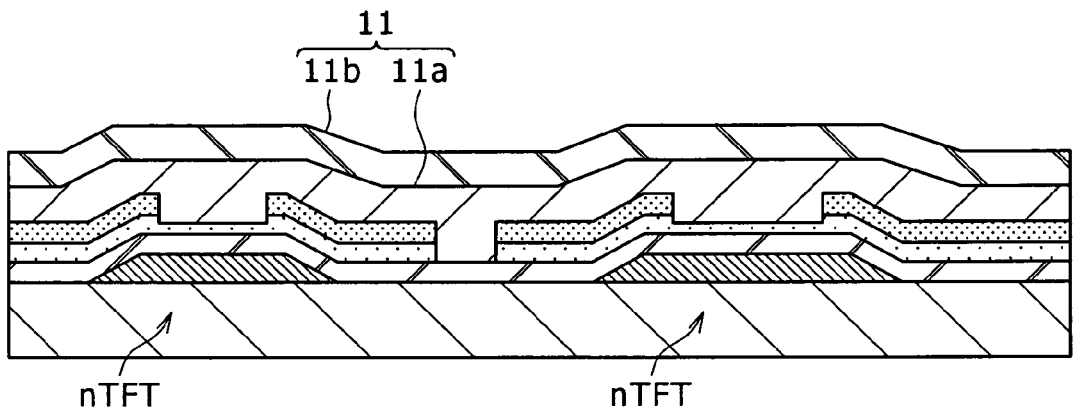
Figure 8E:
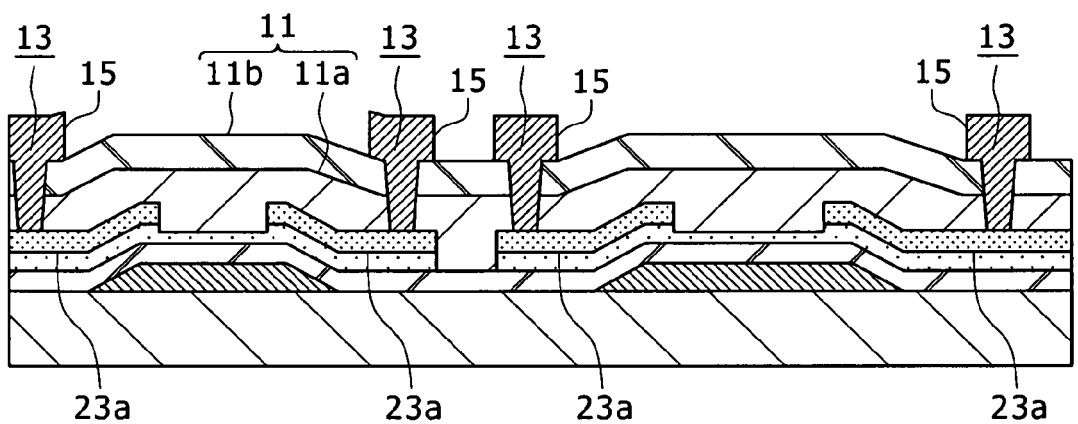
Figure 8F:
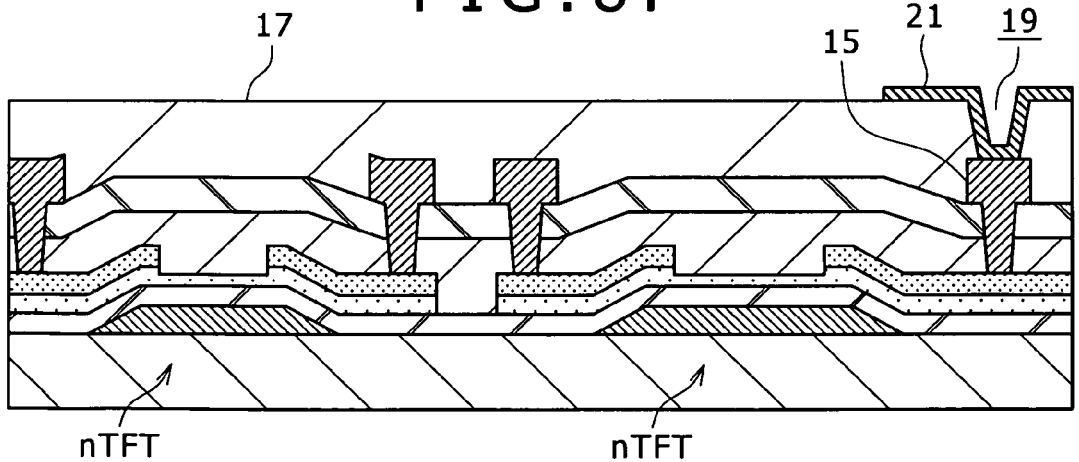

After the foregoing, steps shown in FIGS. 8D to 8F are conducted in the same manner as described referring to FIGS. 6H to 6J in the first example above.

More specifically, first, as shown in FIG. 8D, an inter-layer insulation film 11 of a two-layer structure composed of a silicon oxide thin film 11a and a hydrogen-containing silicon nitride thin film 11b is formed in the state of covering the thin film transistors nTFT formed above. Thereafter, a hydriding treatment is conducted.

Next, as shown in FIG. 8E, the inter-layer insulation film 11 is provided with contact holes 13 reaching the source/drain regions 23a, and, further, wiring electrodes 15 connected to the source/drain regions 23a are formed.

Thereafter, as shown in FIG. 8F, a flattening insulation film 17 is formed by application, and the flattening insulation film 17 is provided with contact holes 19 reaching the wiring electrodes 15 of the thin film transistors nTFTs to be used as pixel electrodes. Next, pixel electrodes 21 connected to the wiring electrodes 15 through the contact holes 19 are formed.

By the foregoing, a driving panel is completed. The subsequent manufacturing procedure for a display is the same as in the first example above.

According to this third example of the manufacturing method as above, also, Film Forming Method 1 as above-described is applied to the formation of the microcrystalline silicon thin film 7, so that the same effects as in the first example can be obtained. In addition, Film Forming Method 5 is also applied to the formation of the n-type microcrystalline silicon thin film 23 to be the source/drain regions 23a, so that it is possible to enhance the efficiency of the fabrication process for the channel etch type bottom gate TFTs. Furthermore, since the formation of the microcrystalline silicon thin film 7 and the n-type microcrystalline silicon thin film 23 is conducted at a low temperature, a metal having a comparatively low melting point such as Al, Cu, Ag and Au can be used to form the gate electrodes 3, like in the second example.

In this third example, description has been made of the formation of the channel etch type bottom gate TFTs of the single channel configuration including only the n channel. However, in the case of a CMOS configuration, it suffices that the formation of the microcrystalline silicon thin film 23 is conducted twice, once for the n type and once for the p type. In addition, a combination of this with a p channel type thin film transistor of other structure may also be adopted.

Incidentally, while the structure in which the pixel electrodes 21 are formed on the flattening insulation film 17 has been exemplified in all of the first to third examples described above, the flattening insulation film 17 may not necessarily be provided, and the pixel electrodes 21 may be formed directly on the inter-layer insulation film 11.

Figure 9:
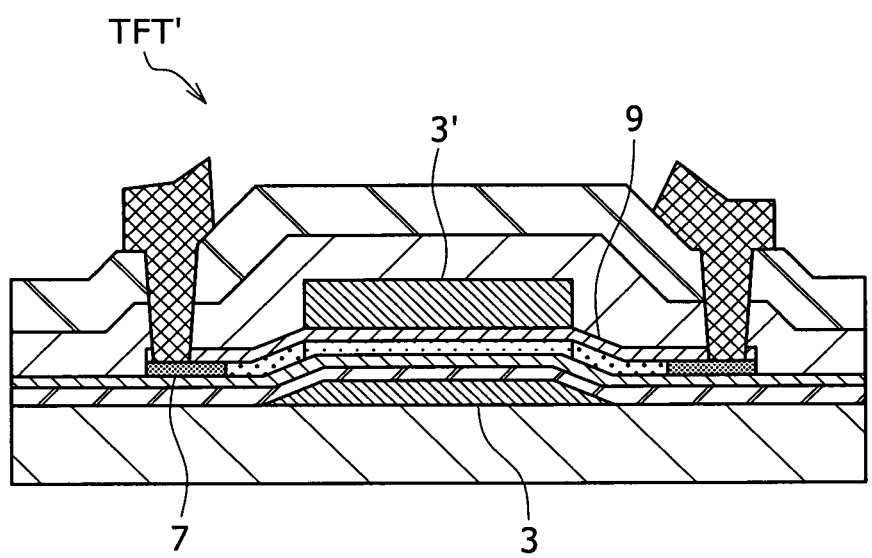
FIG. 9 is a configuration view of another thin film transistor (thin film semiconductor device) based on the invention.

Besides, in all of the first to third examples above, description has been made of the embodiment in which the present invention is applied to the manufacture of the bottom gate type thin film transistor. However, the present invention is also applicable to the manufacture of a dual gate type thin film transistor TFT' as shown in FIG. 9. In this case, after the steps ranging to the step described referring to FIG. 6G above are carried out in the same manner as in the first example, a step of forming a second gate electrode 3' on the microcrystalline silicon thin film 7 formed by applying Film Forming Method 1 based on the present invention, with a silicon oxide film 9 (gate insulation film) therebetween, is carried out. The gate electrode 3' is disposed so as to sandwich the microcrystalline silicon thin film 7 between itself and the upper side of the gate electrode 3. The same potential may be given to the lower and upper gate electrodes 3, 3'; or, alternatively, different potentials may be given to these gate electrodes, thereby intentionally controlling the threshold voltage.

Figure 10:
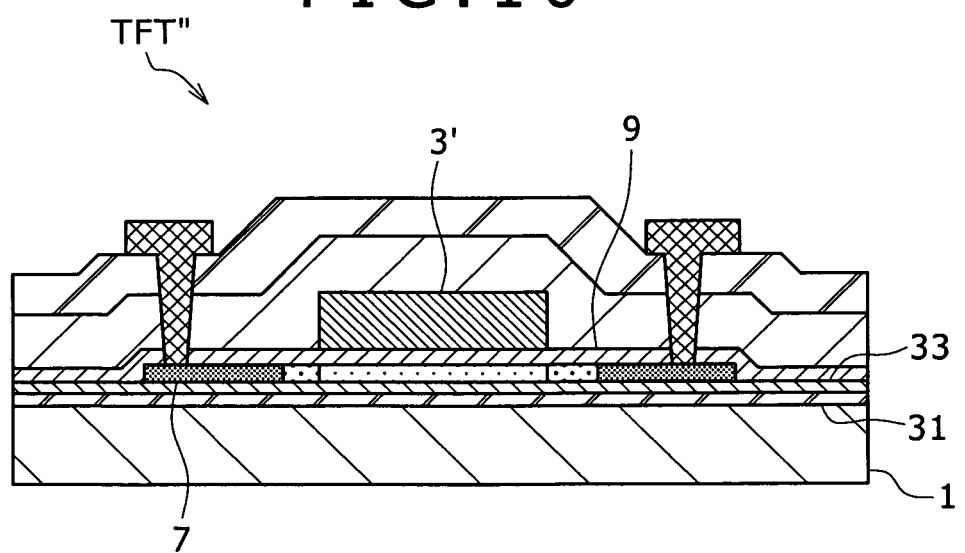
FIG. 10 is a configuration view of a further thin film transistor (thin film semiconductor device) based on the invention.

Besides, the present invention is also applicable to the manufacture of a top gate type thin film transistor TFT" as shown in FIG. 10. In this case, a silicon nitride film 31 as a buffer layer and a silicon oxide film 33 are formed in this order over a substrate 1, and a microcrystalline silicon thin film 7 is formed on the upper side of the same by applying Film Forming Method 1 based on the present invention. Then, the microcrystalline silicon thin film 7 is patterned into an island-like shape, a gate insulation film composed of a silicon oxide film 9 is formed in the state of covering the same, and a gate electrode 3' is formed thereon. Then, by ion implantation conducted by using the gate electrode 3' alone or together with an optionally formed resist pattern as a mask, an impurity is introduced into the microcrystalline silicon thin film 7, thereby forming an LDD diffusion layer and source/drain regions.

Furthermore, while the method of manufacturing a thin film semiconductor device by applying the present invention to the fabrication of a display using thin film transistors has been described in the first to third examples above, the present invention is applicable not only to the displays including thin film transistors but also to the method for manufacturing a thin film semiconductor device using a crystalline silicon thin film such as photoelectric conversion devices such as solar cells and photosensors, whereby the same effects as above-mentioned can be obtained.

In addition, the formation of the microcrystalline silicon thin film 7 can be conducted by application of any of Film Forming Methods 2 to 4.

EXAMPLES

Now, the results of evaluation of film quality, film forming rate and the like of microcrystalline silicon thin films formed by application of Film Forming Method 1 (see FIG. 2) will be described.

Table 1 below shows the film forming gases and flow rates used in the steps. Incidentally, as the substrate W, a substrate obtained by forming a silicon oxide thin film in a thickness of 100 nm on a glass substrate by a plasma CVD process was used.

TABLE 1

| | <Film Forming Method 1> | | |
|---|---|---|---|
| | | Film Forming Step S2 | |
| | Nucleation Step S1 Film forming gas flow rate $Si_2H_6/GeF_4/H_2$ | Film forming gas flow rate $Si_2H_6/H_2$ | Flow rate ratio R |
| Sample 1 | 30/3/700 (sccm) | 10/250 (sccm) | 26 |
| Sample 2 | | 10/500 (sccm) | 51 |
| Sample 3 | | 10/750 (sccm) | 76 |
| Sample 4 | | 10/1000 (sccm) | 101 |

Flow rate ratio R: (total flow rate)/($Si_2H_6$ flow rate)

First, in the nucleation step S1, while the film forming gases as given in Table 1 were used at the respective flow rates shown, reactive thermal CVD was conducted for 300 sec under the conditions of a pressure inside the process chamber of 270 Pa and a substrate temperature of 450° C., to produce crystalline nuclei.

Next, in the film forming step S2, while maintaining the pressure inside the process chamber of 270 Pa and the substrate temperature of 450° C., the film forming gases as given in Table 1 were used at the respective flow rates shown, and a plasma was generated, to form a microcrystalline silicon thin film. Incidentally, in the parallel flat plate type plasma CVD apparatus, the inter-electrode distance was 25 mm, the electrode area was 2500 $cm^2$, the high-frequency power was 1.2 kW, and the film forming time was 5 min.

Each of the microcrystalline silicon thin films of samples 1 to 4 formed in this manner was subjected to measurement of Raman spectrum by use of a reference light with a wavelength of 514 nm, and the crystallinity ratio C of each of the microcrystalline silicon films was obtained from the measurement result. The crystallinity ratio C here is the ratio of the crystalline component (the sum of the crystal volumetric fraction Ic and the microcrystal volumetric fraction Iu) to the total volume, obtained from the Raman spectrum of the thin film, that is the crystallinity ratio $C=(Ic+Iu)/(Ic+Iu+Ia)$, where Ia is the amorphous component volumetric fraction.

Figure 11:
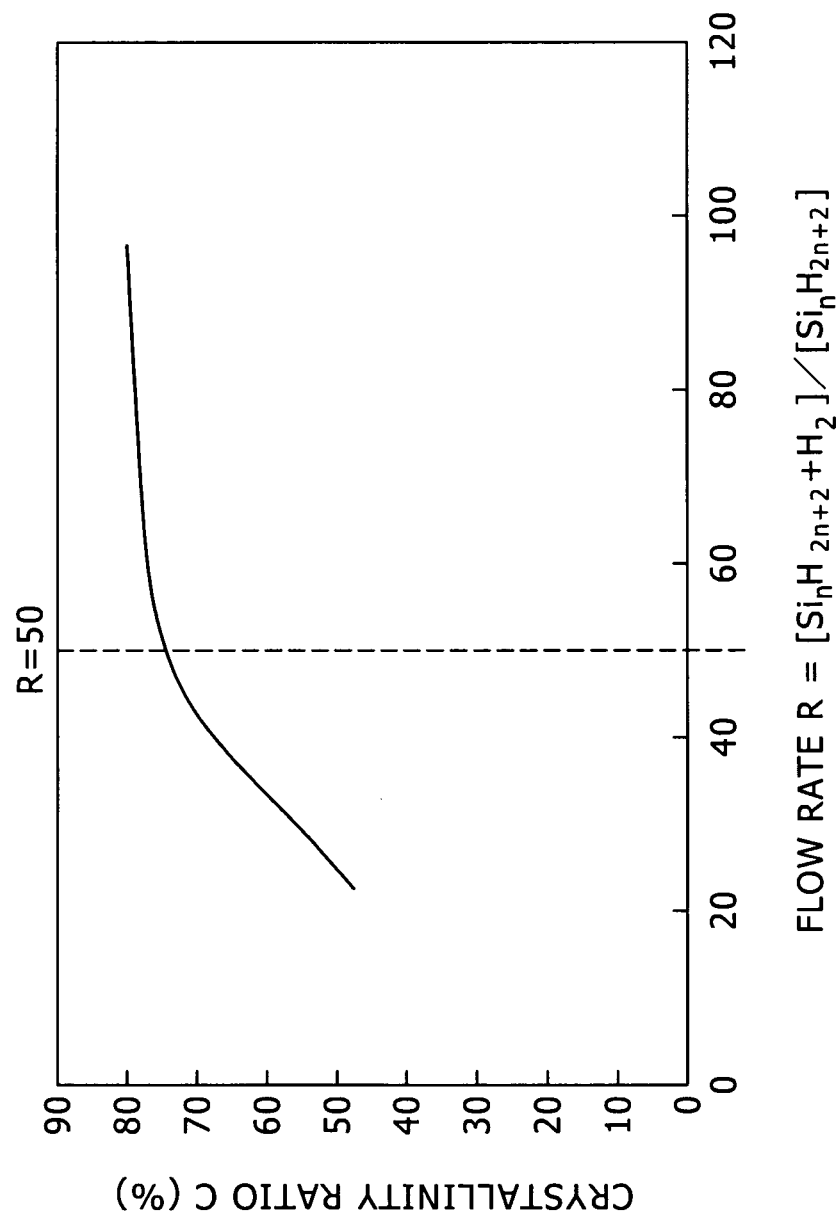
FIG. 11 is a graph showing the relationship between the crystallinity ratio C in a microcrystalline silicon film obtained based on Film Forming Method 1 and the flow rate ratio R between the flow rate of a high order silane gas and the total flow rate of film forming gases.

FIG. 11 shows the relationship between the crystallinity ratio C of each of the microcrystalline silicon films obtained as above-mentioned and the flow rate ratio R, that is, the ratio between the flow rate of the high order silane gas and the total flow rate of the film forming gases.

As is clear from FIG. 11, the rise in the crystallinity ratio C tends to be saturated as the flow rate ratio R increases to or above 50. On the contrary, as the flow rate ratio R decreased below 50, the crystallinity ratio is rapidly lowered, so that a film with good crystallinity may not be obtained. Thus, it was confirmed that when the flow rate ratio R is set to be not less than 50 in the film forming step S2, a microcrystalline silicon film with stable and good crystallinity can be obtained. It is also seen that a microcrystalline silicon film with better crystallinity can be obtained when the flow rate ratio R is not less than 60.

Figure 12:
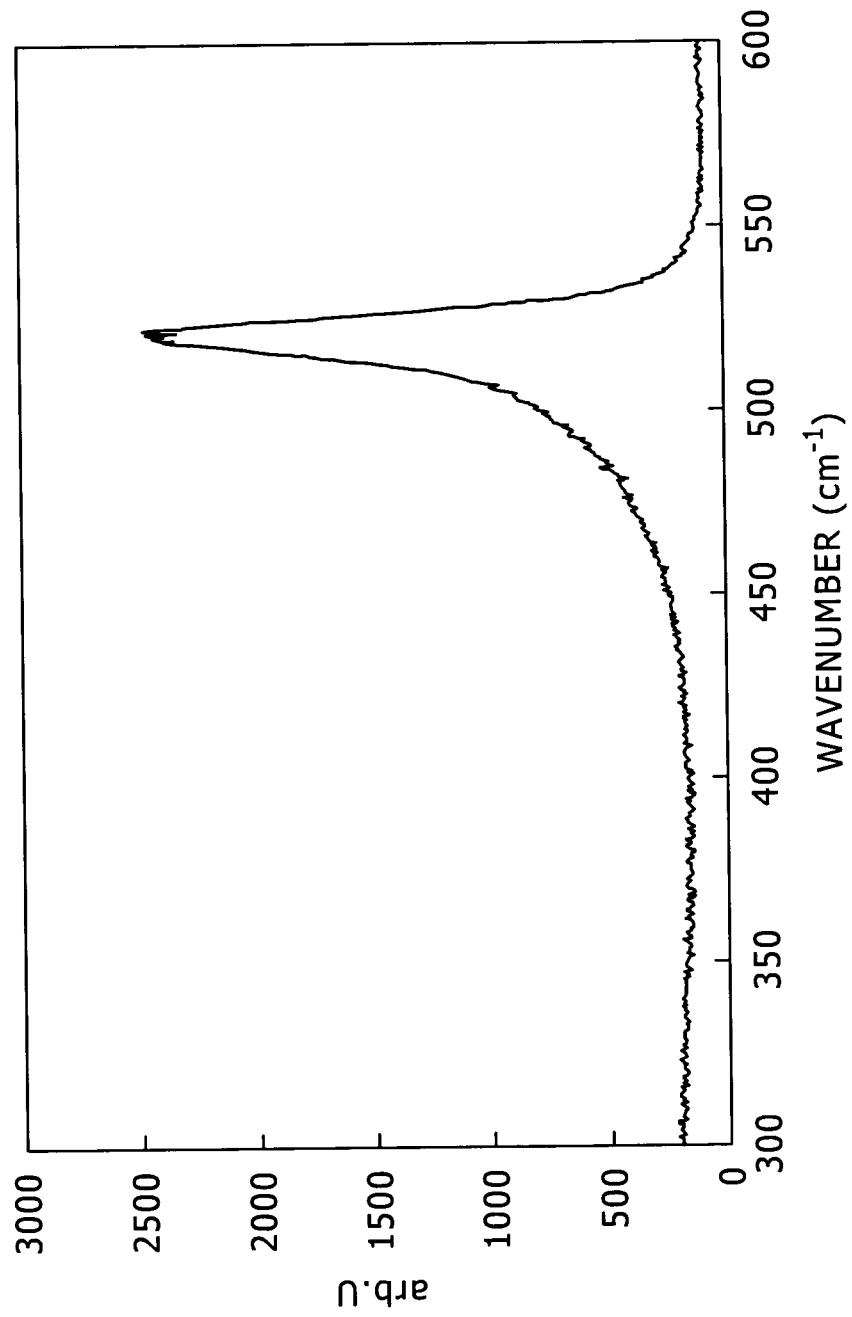
FIG. 12 shows the Raman spectrum of a microcrystalline silicon thin film of Sample 4 obtained based on Film Forming Method 1.

FIG. 12 shows the Raman spectrum of a microcrystalline silicon thin film formed as Sample 4 (flow rate ratio R: 101). As is represented by this Raman spectrum, of the microcrystalline silicon thin films of Samples 1 to 4, the microcrystalline silicon thin films of Samples 2 to 4 having a flow rate ratio R of not less than 50 gave Raman spectra in which a sharp peak was observed in the vicinity of 518 to 520 $cm^{-1}$ that corresponds to the TO phonon mode of the Si—Si bond showing Si including a crystalline structure. The half width of the peak was 9.7 to 10.8 $cm^{-1}$.

Further, upon observation of the surfaces of the microcrystalline silicon thin films of Samples 1 to 4 by a scanning electron microscope, it was confirmed that microcrystalline silicon with a crystal grain diameter of 20 to 100 nm had been grown in Samples 2 to 4 formed at a flow rate ratio R of not less than 50. In addition, upon TEM observation of sections of the samples, it was found that crystal grains having a columnar crystal structure had grown from the substrate surface in Samples 1 to 4.

Through the above-mentioned observations, it was confirmed that Film Forming Method 1 makes it possible to form a microcrystalline silicon thin film composed of nano-crystalline silicon having a crystal grain diameter of several nanometers and microcrystalline silicon having a crystal grain diameter of 10 to 100 nm. Besides, from the results of the TEM observation of the sections, it was confirmed that microcrystalline silicon thin films with good crystallinity throughout the whole region in the film thickness direction had been obtained.

In addition, the film forming rate calculated from the thickness of the microcrystalline silicon thin film of Sample 4 and the film forming time (5 min) thereof was 88 nm/min. This film forming rate is about 10 times higher than the film forming rates of 8 to 9 nm/min achieved by the reactive thermal CVD process (substrate temperature: 450° C.) shown in Patent Document 1. Thus, it was confirmed that the film forming rate can be enhanced by forming the microcrystalline silicon thin film by the plasma CVD process using a high order silane gas as a film forming gas.

Figure 13:
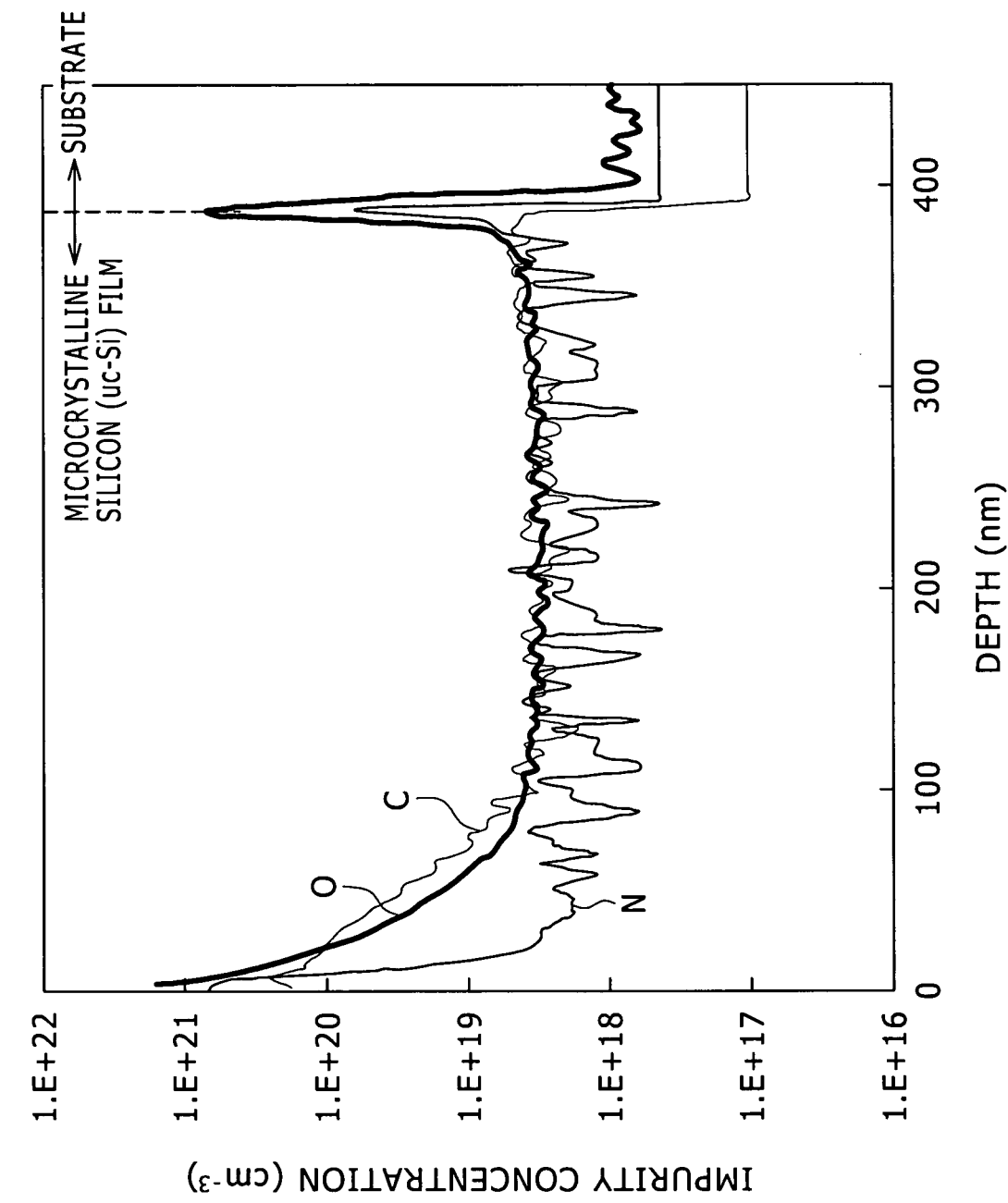
FIG. 13 shows an impurity concentration profile obtained by SIMS analysis of the microcrystalline silicon thin film of Sample 4 obtained based on Film Forming Method 1.

Furthermore, the impurity concentration in the microcrystalline silicon thin film of Sample 4 was analyzed by secondary ion mass spectrometry (SIMS). FIG. 13 shows the impurity concentration profile obtained upon the SIMS analysis. Incidentally, in the SIMS analysis, the impurity concentration in the substrate serving as an under layer for the microcrystalline silicon film was not measured, and, therefore, the profile of concentration in the substrate as seen in the diagram does not reflect the actual concentration profile.

As is clear from FIG. 13, the oxygen (O) concentration in the microcrystalline silicon film of Sample 4 obtained by application of Film Forming Method 1 was $3\times10^{18}$ cm$^3$, which indicates a lowering in oxygen concentration by a factor of 1/50 to 1/100, as compared with the film forming method based on plasma CVD according to the related art. It was also found that the concentrations of carbon (C) and nitrogen (N) had been suppressed to low levels of $2\times10^{18}$ to $3\times10^{18}$ cm$^3$.

In addition to the above-mentioned effects, it is seen from the Raman spectrum shown in FIG. 12 that the microcrystalline silicon thin film obtained by the film forming method based on the present invention has little internal stress in the film. In general, in the Raman spectrum of a microcrystalline silicon thin film including a crystalline structure, a peak appears in the vicinity of 510 cm$^{-1}$, i.e., on the lower side of the peak at 520 cm$^{-1}$ in the Raman spectrum of original single-crystalline silicon, due to the internal stress in the film. On the other hand, the peak in the Raman spectrum of the microcrystalline silicon thin film obtained here is extremely close to the peak at 520 cm$^{-1}$ in the Raman spectrum of single-crystalline silicon, from which it is obvious that the microcrystalline silicon thin film obtained here has little internal stress.

Therefore, according to Film Forming Method 1, it is possible to form a microcrystalline silicon thin film having little dispersion of carrier mobility arising from internal stress thereof. As a result, it is possible, in a thin film semiconductor device using the microcrystalline silicon thin film, to make even the characteristics relating to the carrier mobility.

Incidentally, while the substrate temperature was set at 400° C. in the method of forming the microcrystalline silicon thin films of Samples 1 to 4 described above, microcrystalline silicon thin films can also be formed at more lower substrate temperatures of about 100 to 300° C., by optimizing the film forming conditions such as the pressure in the process chamber (in the film forming atmosphere), the RF power, and the flow rate ratio between the raw material gases and the diluting gas. Since the film formation can be carried out at such a low substrate temperature, the existing plasma CVD apparatus can be used by merely adding a gas system thereto.

Now, the results of evaluation of film quality, film forming rate and the like of microcrystalline silicon thin films formed by application of Film Forming Method 4 (see FIG. 5) will be described.

Table 2 below shows the film forming gases and flow rates used in the film forming step S2'. Incidentally, as the substrate W, a substrate obtained by forming a silicon oxide thin film in a thickness of 100 nm on a glass substrate by a plasma CVD process was used.

TABLE 2

<Film Forming Method 4>

| | Film Forming Step S2' Film forming gas flow rate Si$_2$H$_6$/Ar/H$_2$ | Film Forming Time |
|---|---|---|
| Sample 5 | 10/500/1000 (sccm) | 5 min |
| Sample 6 | 10/1000/1000 (sccm) | |
| Comparative Example | 10/100/0 (sccm) | 10 min |

In this case, the film forming gases as shown in Table 2 were used at the respective flow rates shown, and a plasma was generated at a pressure inside the process chamber of 270 Pa and a substrate temperature of 400° C., to form each of the microcrystalline silicon thin films on the substrate. Incidentally, in the parallel flat plate type plasma CVD apparatus, the inter-electrode distance was 25 mm, the electrode area was 2500 cm$^2$, the high-frequency power was 1.2 kW, and the film forming time was 5 min. In Comparative Example in which the hydrogen gas was not used, the film forming time was 10 min.

Figure 14:
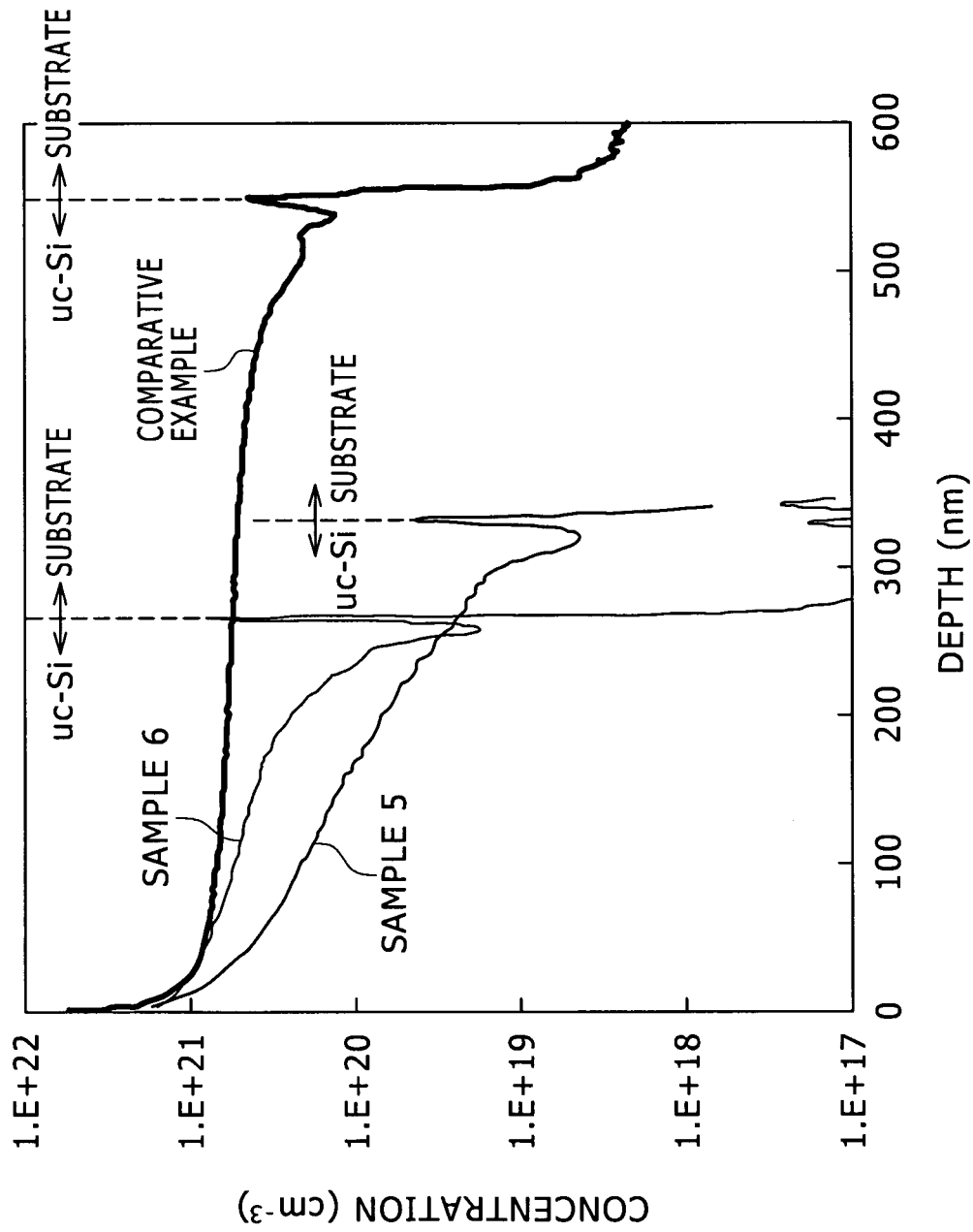
FIG. 14 shows oxygen concentration profiles obtained by SIMS analysis of microcrystalline silicon thin films of Samples 5 and 6, obtained based on Film Forming Method 4, and of Comparative Example.

The oxygen concentrations in the microcrystalline silicon thin films of Samples 5 and 6 and Comparative Example thus formed were analyzed by secondary ion mass spectrometry (SIMS). FIG. 14 shows the oxygen concentration profiles obtained upon the SIMS analysis. Incidentally, in the SIMS analysis, the impurity concentrations in the substrate serving as an under layer for the microcrystalline silicon film were not measured, and, therefore, the profiles of concentration in the substrate as seen in the diagram do not reflect the actual concentration profiles.

As is clear from FIG. 14, it was confirmed that the oxygen concentrations in the microcrystalline silicon films of Samples 5 and 6 formed by application of Film Forming Method 4 were suppressed to a lower level, as compared to the oxygen concentration in the microcrystalline silicon film of Comparative Example.

Particularly, Sample 5 obtained by setting the hydrogen gas flow rate to be higher than the inert gas flow rate showed a lowered oxygen concentration of $4\times10^{18}$ cm$^{-3}$ in the region of film thickness of about 50 nm from the substrate. In addition, the film forming rate in this case was 1.1 nm/min, on average for the film forming time of 5 min.

On the other hand, in Sample 6 obtained by setting the hydrogen gas flow rate and the inert gas flow rate to be equal, the oxygen concentration rose steeply from a point immediately above the substrate; besides, the oxygen concentration was no less than $1.7\times10^{19}$ cm$^{-3}$ even in the lowest concentration region, and the oxygen concentration on average for the whole film thickness was $4.5\times10^{20}$ cm$^{-3}$. Therefore, in the case of applying Film Forming Method 4, the inert gas flow rate has to be lower than the hydrogen gas flow rate, in order to realize a low oxygen concentration region. The inert gas flow rate is preferably about ½ times the hydrogen gas flow rate. In this case, also, the flow rate ratio R between the flow rate of the high order silane gas and the total flow rate of the film forming gases is preferably not less than 50, like in the case of Film Forming Method 1.

Incidentally, as is clear from the oxygen concentration profile for Comparative Example, in the case where hydrogen is not contained in the diluting gas, the oxygen concentration is not less than $1\times10^{20}$ cm$^{-3}$, starting from a position immediately above the substrate, and there is not any low oxygen concentration region.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a thin film semiconductor device, the method comprising:
   a nucleation step of using a silane gas and a germanium halide gas in a reactive thermal chemical vapor deposition process to produce crystalline nuclei on a substrate, said silane gas being $Si_nH_{2n+2}$ (n=2, 3, ... ); and
   a forming step of using film forming gases in a plasma chemical vapor deposition process to form a microcrystalline silicon thin film on the substrate, the nucleation step being performed before the forming step,
   wherein said film forming gases include a high order silane gas and a hydrogen gas, said high order silane gas being represented by a formula $Si_nH_{2n+2}$ (n=2, 3, ... ), and
   the ratio of (the flow rate of said film forming gases)/(the flow rate of said high order silane gas) is not less than 50.

2. The method of manufacturing the thin film semiconductor device as set forth in claim 1, wherein said film forming gases include an inert gas, the flow rate of said inert gas being not more than the flow rate of said hydrogen gas.

3. The method of manufacturing the thin film semiconductor device as set forth in claim 1, further comprising: a step of supplying a diluting gas, said diluting gas including said hydrogen gas.

4. The method of manufacturing the thin film semiconductor device as set forth in claim 3, wherein the step of supplying the diluting gas is carried out by a plasma chemical vapor deposition process.

5. The method of manufacturing the thin film semiconductor device as set forth in claim 3, wherein the step of supplying the diluting gas produces the crystalline nuclei on said substrate.

6. The method of manufacturing the thin film semiconductor device as set forth in claim 3, wherein the step of supplying the diluting gas is performed simultaneous with the step of forming the microcrystalline silicon thin film.

7. The method of manufacturing the thin film semiconductor device as set forth in claim 3, wherein the step of supplying the diluting gas is performed before the step of forming the microcrystalline silicon thin film.

8. The method of manufacturing the thin film semiconductor device as set forth in claim 7, wherein the step of supplying the diluting gas further comprises:
   a step of supplying the germanium halide gas and said high order silane gas.

9. The method of manufacturing the thin film semiconductor device as set forth in claim 8, wherein the ratio of (the flow rate of said germanium halide gas)/(the flow rate of said high order silane gas) is not more than 1/10.

10. The method of manufacturing the thin film semiconductor device as set forth in claim 8, wherein step of supplying the diluting gas is carried out by a reactive thermal chemical vapor deposition process or a plasma chemical vapor deposition process.

11. The method of manufacturing the thin film semiconductor device as set forth in claim 8, wherein said diluting gas includes an inert gas.

12. The method of manufacturing the thin film semiconductor device as set forth in claim 8, wherein the step of forming the microcrystalline silicon thin film includes: a step of terminating supply of said germanium halide gas.

13. The method of manufacturing the thin film semiconductor device as set forth in claim 8, wherein the step of forming the microcrystalline silicon thin film includes: a step of supplying an inert gas, the flow rate of said inert gas being not more than the flow rate of said hydrogen gas.

14. The method of manufacturing the thin film semiconductor device as set forth in claim 1, wherein in the nucleation step, the ratio of (the flow rate of said germanium halide gas)/(the flow rate of said silane gas) is not more than 1/10.

15. The method of manufacturing the thin film semiconductor device as set forth in claim 1, wherein said silane gas is said high order silane gas.

16. The method of manufacturing the thin film semiconductor device as set forth in claim 1, wherein in the nucleation step, etching is not carried out.

17. The method of manufacturing the thin film semiconductor device as set forth in claim 16, wherein:
   a stage and an upper electrode are used, the stage functioning as a lower electrode;
   the substrate is disposed on the stage;
   in the nucleation step, a high-frequency voltage is not applied to both of the stage and the upper electrode; and
   in the forming step, the high-frequency voltage is applied to both of the stage and the upper electrode.

* * * * *